United States Patent [19]

Borgen et al.

[11] Patent Number: 5,510,790
[45] Date of Patent: Apr. 23, 1996

[54] DIGITAL CIRCUIT FOR THE INTRODUCTION OF DITHER INTO AN ANALOG SIGNAL

[75] Inventors: Gary S. Borgen, Camarillo; Christian L. Houlberg, Ventura, both of Calif.

[73] Assignee: The United States of America as represented by the Secretary of the Navy, Washington, D.C.

[21] Appl. No.: 233,283

[22] Filed: Apr. 25, 1994

[51] Int. Cl.[6] .................................................. H03M 1/18
[52] U.S. Cl. ............................ 341/131; 341/155; 341/139
[58] Field of Search ...................................... 341/131, 118, 341/139, 141, 155

[56] References Cited

U.S. PATENT DOCUMENTS

| 5,187,481 | 2/1993 | Hiller | 341/131 |
| 5,189,418 | 2/1993 | Bartz et al. | 341/131 |

Primary Examiner—Brian K. Young
Attorney, Agent, or Firm—David S. Kalmbaugh; Melvin J. Sliwka

[57] ABSTRACT

An electronics circuit for accurately digitizing an analog audio, video or like data signal into a fourteen bit digital equivalent signal/words having thirteen data bits and a sign bit and then introducing a dither component into the digital equivalent signal. A Read Only Memory which generates an eight bit dither component to be added to a selected eight bits of each fourteen bit digital equivalent sample. The combination of an automatic gain control circuit and a data selector circuit is provided which selects eight of the thirteen data bits of each sample to supply to a binary adder which adds the dither component to each sample. The eight selected bits of each thirteen bit data sample provide optimum video, audio or like information for the sample. A binary adder is also provided to add the dither component to each bit sample before providing the resultant signal to a missile's telemetry system.

10 Claims, 15 Drawing Sheets

DIGITAL CIRCUIT FOR THE INTRODUCTION OF DITHER INTO AN ANALOG SIGNAL

BACKGROUND OF THE INVENTION

1. Field of the Invention

The present invention relates generally to the conversion of electric signals from analog to digital form. More specifically, the present invention relates to a digital circuit for translating an analog video or like analog signal into an equivalent digital signal with the addition of dither which is an artificially created noise signal and which provides for a reduction of noise and distortion in the signal.

2. Description of the Prior Art

The pulse code modulation (PCM) or digital processing of analog audio signals has become, or is becoming, the mainstream of high fidelity sound recording and reproduction with the advent and ever increasing commercial acceptance of compact discs. The digital processing of analog signals in the low to high frequency range is also becoming highly useful for analyzing the performance of weapons systems such as guided missiles. For example, the analog data acquired by a guided missile during flight is converted to its digital equivalent and then placed in a digital PCM frame for transmission to a ground station for analysis.

There are, however, some problems left unsolved in the art of digital processing of analog signals. For example, there is a significant difference between the samples of an analog signal and the quantized values of the samples which is generally referred to as "quantization noise" This difference becomes particularly pronounced when the input analog signal is low and there are only a small number of quantization steps, thereby, for example, distorting reproduced sound as higher harmonics in high fidelity sound systems. Even when an input analog audio or like signal level is high, the quantization noise will distort the signal if it changes slowly.

A prior art solution to this quantization noise problem has been the use of dither which is intended to turn the quantization noise into broad band white noise which has little or no effect on reproduced sound or like analog signals and which is generally referred to as "white noise" An analog dither signal is superposed on the analog audio or like signal prior to its digitization and may, or may not be removed from the digitized audio signal.

One system of the prior art adds an analog dither signal, converted from the output from a digital dither generator by a digital to analog converter, to the incoming analog audio or analog data signal. The combined analog data and dither is digitized by an analog to digital converter and then fed to a subtractor circuit. The subtractor circuit is also supplied the digital dither directly from the dither generator. The subtractor circuit then subtracts the dither component from the digital data and dither signal.

A second system of the prior art uses an analog dither generator in combination with a second analog to digital converter for digitizing the analog dither prior to its delivery to the subtractor. In this prior art system, analog dither is added directly to the analog data signal. The resulting dither added data signal is then digitized by the first analog to digital converter and the analog dither is digitized by the second analog to digital converter preparatory to application to the two inputs of the subtractor circuit.

During the conversion process from an analog signal to its digital equivalent, prior art systems often use from as little as three digital bits to one digital bit to represent the incoming analog signal. However, in certain applications, such as data received from a missile during flight, there is a need to increase the resolution of the equivalent digital signal provided by the missile's telemetry system. This necessitates the use of, for example, fourteen bit equivalent digital words to represent the incoming analog signal. This increase in the number of bits to represent the incoming analog signal results in a significant decrease in the error being introduced in the higher resolution bits (least significant bits) and a significant increase in the bandwidth required for transmission of the digital equivalent signal provided by the missile's telemetry system. By utilizing a form of automatic gain control (AGC) after the incoming analog signal is converted to its digital fourteen bit equivalent, a subset, for example, of eight of the fourteen bits may be transmitted with a significant increase in the accuracy and resolution of the transmitted digital information within a reduced bandwidth.

In view of the foregoing, it is an object of the present invention to provide an electronics circuit for accurately converting an analog audio or like data signal into its digital equivalent.

It is a further object of the present invention to provide a reliable yet relatively simplistic and inexpensive electronics circuitry for converting an analog audio or like data signal into its digital equivalent.

It is yet a further object of the present invention to provide electronics circuitry which is capable of operation with high resolution and conversion accuracy.

It is still a further object of the present invention to provide electronics circuitry which is capable of operation with a minimum bandwidth.

The above and other novel features and advantages of the present invention and the manner of realizing them will become more apparent and the invention will be best understood from a study of the following description and appended claims, with reference to the attached drawings.

SUMMARY OF THE INVENTION

According to the present invention, briefly stated, there is provided an electronics circuit for accurately digitizing an analog audio, video or like data signal into a fourteen bit digital equivalent signal, extracting a set of information bits, and then introducing a dither component into the digital equivalent signal. The fourteen bit digital equivalent signal/word includes thirteen data bits and a sign bit which indicates whether the digital equivalent signal is positive or negative.

The electronics circuit of the present invention is characterized by an Read Only Memory (ROM) which generates an eight bit dither component to be added to the digital equivalent signal and a synchronous binary counter which provides addressing to the ROM. A first in first out memory is used for temporary storage of the fourteen bit digital equivalent signal until the electronics circuit is ready to process the digital equivalent signal.

There is provided to the electronics circuit a three bit digital signal which is decoded by a decoding circuit to provide a five bit digital signal which is supplied to an automatic gain control circuit and a down counter. There is also provided to the automatic gain control circuit a digital sample which includes the four most significant bits of each digital equivalent signal/word and the sign bit.

The five bit signal when provided to the down counter initializes the down counter to a count which determines the number of digital samples to be processed by the automatic gain control circuit. The down counter then resets the gain control circuit when the count reaches zero by providing a pulse to the gain control circuit. The gain control circuit may either average the digital samples to provide a four bit signal representative of the average value of the digital samples or provide a four bit signal representative of the peak magnitude value for the digital samples. This four bit signal is supplied to a data selector circuit and a gain encoder which then provides a three bit signal indicative of the gain for the digital samples being processed.

Since the electronics circuit of the present invention is limited to providing eight bits for each fourteen bit equivalent word supplied to the circuit, the data selector circuit, in response to this four bit signal, selects nine of thirteen bits (excluding the sign bit) of each sample to supply to a binary adder which adds the dither component to each sample. The eight selected bits with dither added thereto by the binary adder from each fourteen bit sample provide optimum video, audio or like information for the sample.

The binary adder also provides for an overflow condition which results in each of the eight selected bits being set at the logic one state and an underflow condition which results in each of the eight selected bits being set to a logic zero state.

DETAILED DESCRIPTION OF THE PREFERRED EMBODIMENT

Figure 1:
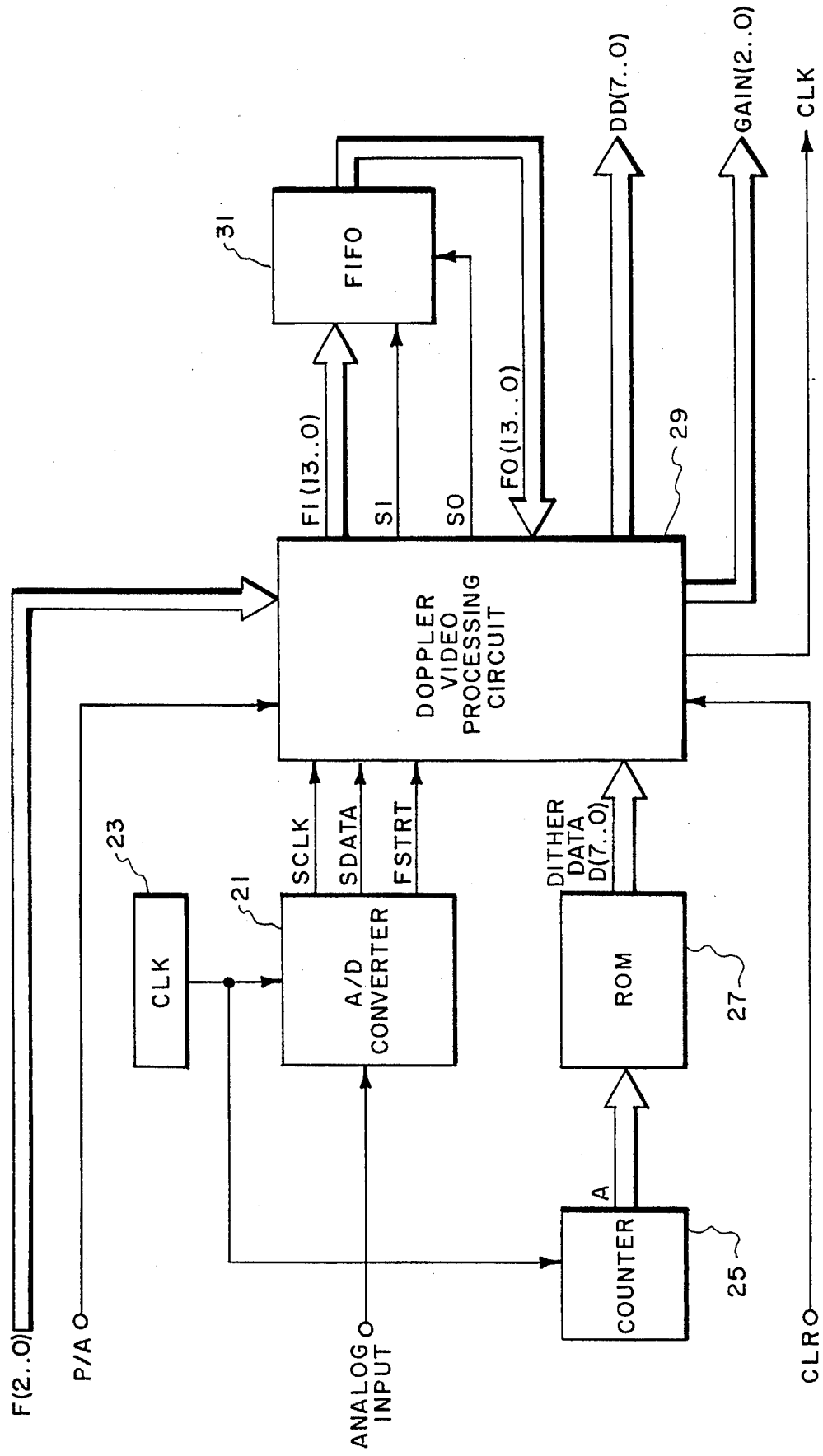
FIG. 1 is a block diagram of the digital circuit for the introduction of dither into an analog video or like signal constituting the present invention.

Referring to FIG. 1 an analog video or like data signal is supplied to the data input of an analog to digital converter 21 which converts the analog data signal to an equivalent fourteen bit digital signal. A clock signal generator 23 supplies a five megahertz system clock signal to the clock input of analog to digital converter 23 with the five megahertz system clock signal being provided to analog to digital converter 23 to allow converter 23 to convert the analog data signal to the equivalent fourteen bit digital signal.

The clock generator 23 is also connected to the clock input so as to supply the five megahertz system clock signal to the synchronous binary counter 25 which, in response to the five megahertz system clock signal, provides addressing to a Read Only Memory (ROM) 27 which functions as a dither generator. Dither generator 27, in turn, provides an eight bit dither signal/word (white noise) to a doppler video processing circuit 29.

The analog to digital converter 21 used in the preferred embodiment of the present invention is a Model MAX121 BiCMOS serial-output, sampling 14-bit analog-to-digital converter manufactured by MAXIM Integrated Products of Sunnyvale, California.

Figure 2:
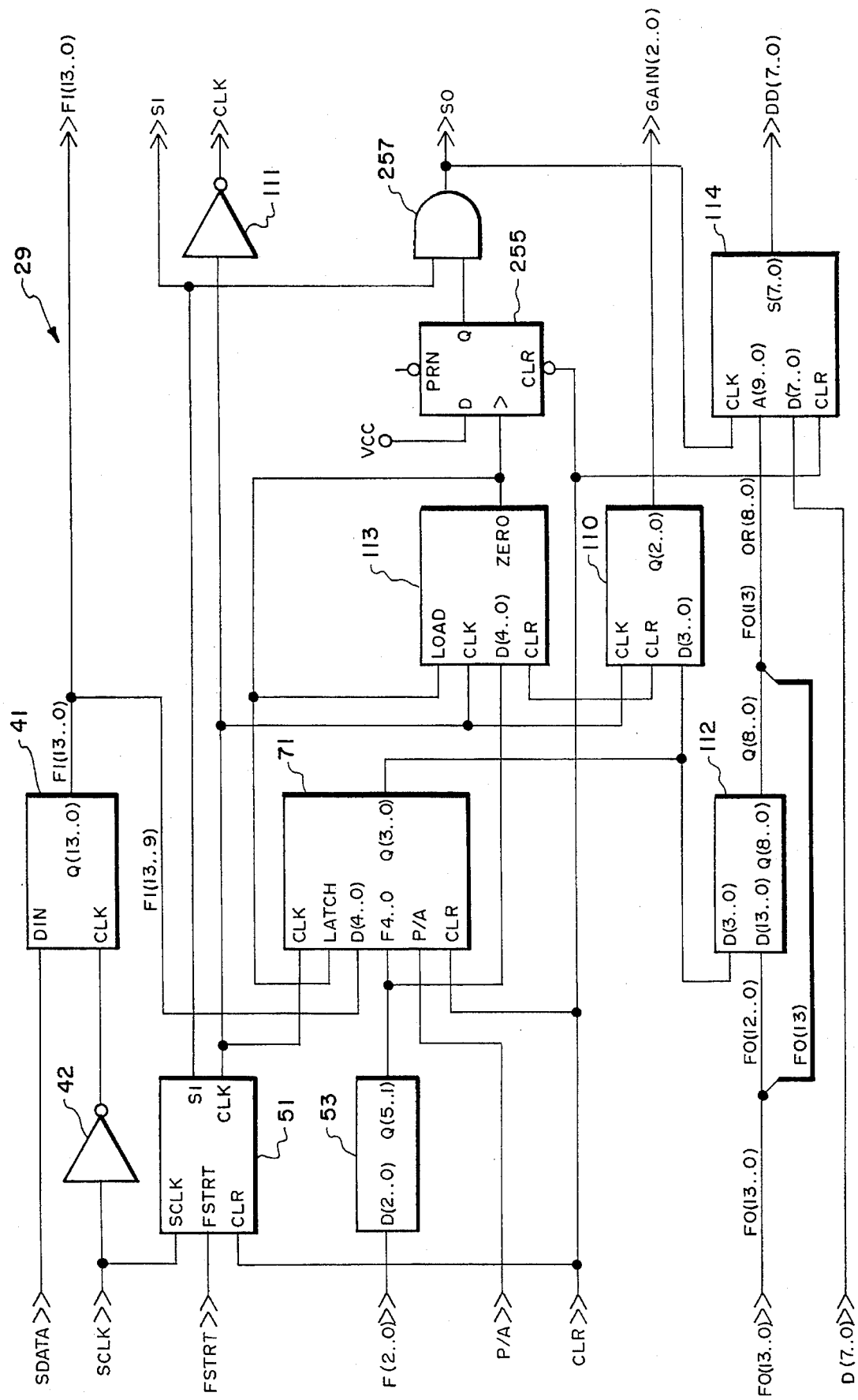
FIG. 2 is a block diagram of the video doppler processing circuit of FIG. 1.
Figure 3:
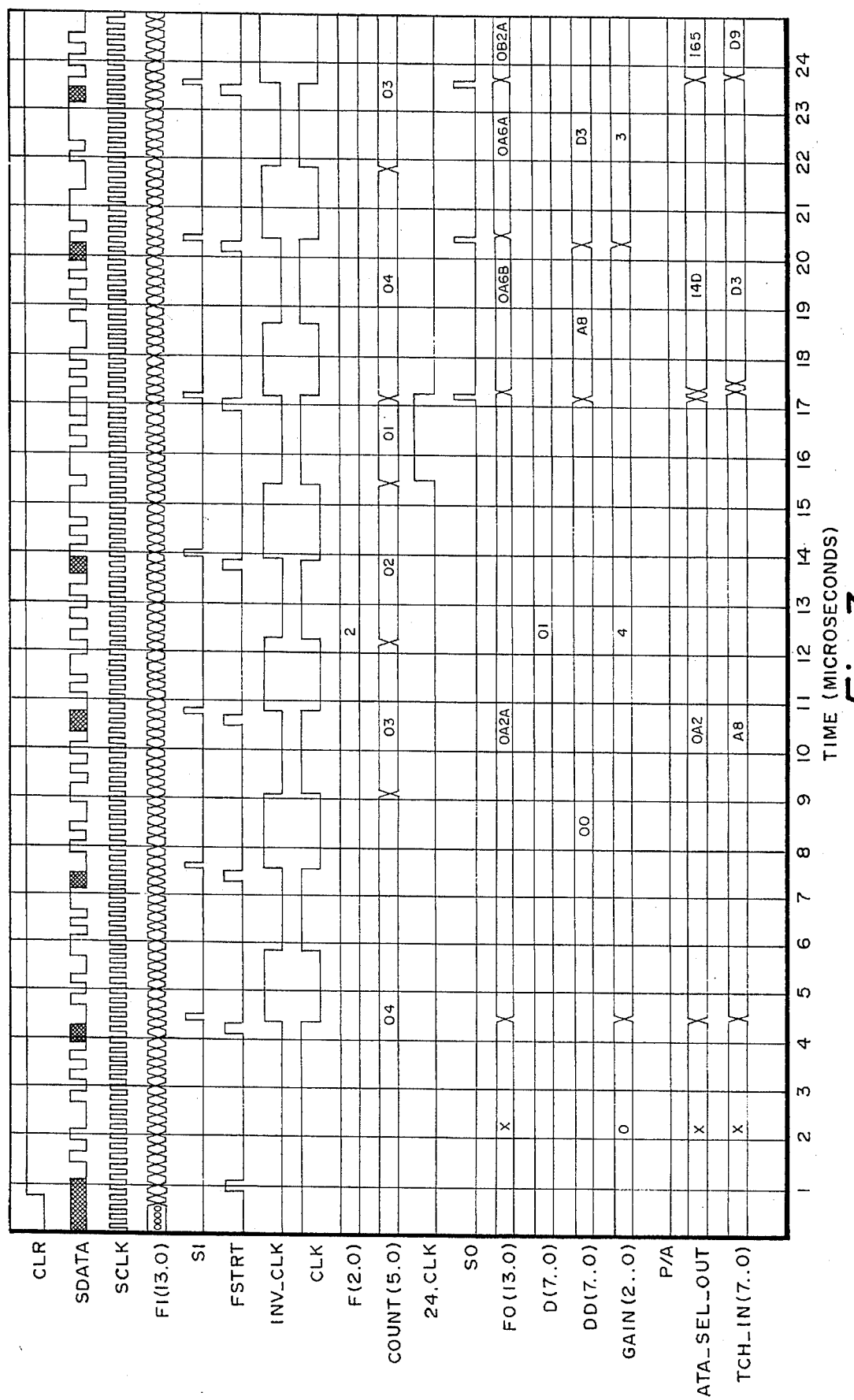
FIG. 3 is a timing diagram illustrating some of the waveforms occurring at the inputs and outputs of the circuit of FIG. 2.
Figure 4:
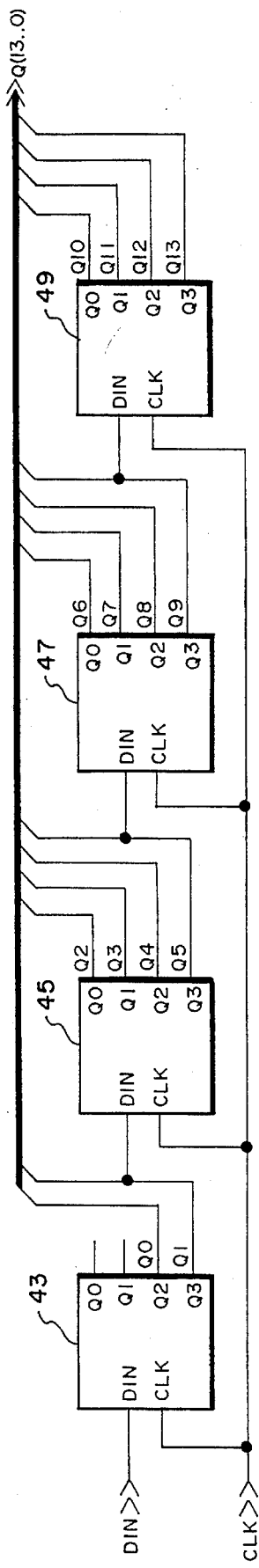
FIG. 4 is a detailed logic circuit diagram of the fourteen bit serial to parallel converter of the circuit of FIG. 2

Referring to FIGS. 1, 2, 3 and 4, doppler video processing circuit 29 receives from analog to digital converter 21 the fourteen bit digital equivalent signal (identified as the SDATA signal of FIG. 3). This fourteen bit digital equivalent signal is supplied to the data input of a fourteen bit serial to parallel shift register 41 which comprises four 4 bit serial to parallel shift registers 43, 45, 47 and 49. Each shift register 43, 45, 47 and 49 is of well known design and may, for example, include four serially connected D type flip-flops, not illustrated. The clock signal used to convert the fourteen bit digital equivalent signal from a serial to a parallel format is the five megahertz system clock signal which is illustrated in FIG. 3 as SCLK.

It should be noted at this time that analog to digital converter 21 also provides the FSTRT signal of FIG. 3 which indicates that analog to digital converter 21 is converting another sample of the incoming analog video or like data signal to its fourteen bit digital equivalent signal. It should also be noted that converter 21 provides data in sixteen bit intervals with the additional two bits being required to allow converter 21 to set up for conversion of a succeeding sample of the incoming analog video or like data signal.

The parallel fourteen bit equivalent words from serial to parallel converter 41 are supplied to a synchronous first-in first-out memory 31. The SI signal of FIG. 3 which is generated by circuit 29 strobes the fourteen bit equivalent words of FIG. 3 into first-in first-out memory 31, while the SO signal of FIG. 3 which is also generated by circuit 29 strobes the fourteen bit equivalent words of FIG. 3 out of first-in first out memory 31 on a first in first out basis.

As is best illustrated by the waveforms of FIG. 3, the first fourteen bit digital stored in memory 31 by the SI signal of FIG. 3 is hexadecimal 0A2A. This hexadecimal 0A2A equivalent signal, FIG. 3, is then provided to the FO(13 . . . 0) input of circuit 29. The second SI pulse of FIG. 3 results in a hexadecimal 0A6B equivalent signal being stored in memory 31. This hexadecimal 0A6A equivalent signal, FIG. 3, is next retrieved from memory 31 by the second SO pulse of FIG. 3 and then provided to FO(13 . . . 0) input of circuit 29. The third SI pulse of FIG. 3 results in a hexadecimal 0A6A equivalent signal being stored within memory 31. This hexadecimal 0A6B equivalent signal, FIG. 3, is next retrieved from memory 31 by the first SO pulse of FIG. 3 and then provided to FO(13 . . . 0) input of circuit 29.

The synchronous first-in first-out memory 31 used comprises four cascadeable 64×4 bit word a synchronous first-in, first-out memories, Model No. CY7C404 manufactured by Cypress Semiconductor of San Jose, Calif.

Referring to FIGS. 1, 2, 3 and 5, there is provided by the missile's telemetry system a three bit word which is supplied to the D(2 . . 0) input of a three to eight bit decoder 53. For the timing waveforms illustrated by FIG. 3 the three bit word is 0,1,0 resulting in logic zeros being supplied to the inputs of inverters 55 and 59 and a logic one being supplied to the input of inverter 57. The output of inverters 55 and 59 will transition to the logic one state resulting in logic ones at the first, second and third inputs of AND gate 67 thereby causing the output of AND gate 67 to transition to the logic one state. The logic one occurring at the output of AND gate 67 and the logic zeros occurring at the outputs of AND gates 61, 63, 65 and 69 are next supplied to the D(4 . . 0) inputs of a gain circuit 71 and the D(4 . . 0) inputs of a down counter 113.

It should be noted that the three bit word supplied to decoder 53 determines the time delay between the SI signal of FIG. 3 and the SO signal of FIG. 3 which for the timing waveforms of FIG. 3 is about twelve microseconds. Thus, as is best illustrated by FIG. 3 four fourteen bit words (SDATA of FIG. 3) are stored in memory 31 when the first stored fourteen bit word is retrieved from memory 31 as a result of the occurrence of the first SO pulse of FIG. 3.

Referring now to FIG. 1, 2, 3 and 6, there is shown a clock generating circuit 51 which receives the five megahertz system clock signal of FIG. 3 from analog to digital converter 21 as well as the FSTRT signal of FIG. 3. and a CLRN signal, FIG. 3, which is provided by the missile's telemetry system. As shown in FIG. 3, a logic zero CLRN pulse is supplied to the CLRN input of clock generating circuit 51 clearing Flip-Flops 77, 79, 85, 89, 93, 101 and 109 which results in logic zeros at the Q outputs of these Flip-Flops.

The five megahertz system clock signal (SCLK, FIG. 3) is supplied to the SCLK input of clock generating circuit 51 and then inverted by an inverter 75 resulting in an inverted system clock signal being provided to the clock input of Flip-Flop 79. The first FSTRT pulse of the FSTRT signal of FIG. 3 occurring after the CLRN signal transitions to the logic one state will cause the logic one at the D input of Flip-Flop 85 to be clocked to its Q output. This logic one is supplied to the D input of Flip-Flop 79 and then clocked through Flip-Flop 79 to its Q output by the next FSTRT pulse of the FSTRT signal of FIG. 3. This logic one is supplied to the D input of Flip-Flop 79 and then clocked through Flip-Flop 79 to its Q output by the inverted system clock signal resulting in logic one at the first input of an AND gate 73 and the input of an inverter 81. The logic one at the first input of AND gate 73 enables AND gate 73 allowing a single clock pulse of the system clock signal of FIG. 3 to pass through AND gate 73 to the SI output of clock generating circuit 51 resulting in the first SI pulse of the SI signal of FIG. 3.

Inverter 81 inverts the logic one at its input to a logic zero which passes through AND gate 83 to the clear input of Flip-Flop 77 clearing the Q output of Flip-Flop 77 to the logic zero state. This logic zero is supplied from the Q output of Flip-Flop 77 and clocked through Flip-Flop 79 to the first input AND gate 73 disabling AND gate 73.

Another FSTRT pulse when provided to the clock input of Flip-Flop 77 clocks the logic one at the D input of Flip-Flop 77 to the D input of Flip-Flop 79. The inverted system clock signal of FIG. 3 will next clock the logic one at the D input of Flip-Flop 79 to the first input of AND gate 73 enabling AND gate 73 allowing another clock pulse of the system clock signal to pass through AND gate 73 to SI output of circuit 51 resulting in a second SI pulse of the SI signal of FIG. 3. Successive SI pulses of the SI signal of the FIG. 3 are provided in the same manner.

The SI pulse of the SI signal of FIG. 3 is provided to the first input of an OR gate 105 causing the output of OR gate 105 to transition to the logic one state. The SI pulse of the SI signal of FIG. 3 is also supplied through OR gate 105 to the clock input of a Flip-Flop 109 clocking the logic one at the D input of Flip-Flop 109 to its Q output and then to the second input of OR gate 105 so that the output of OR gate 105 remains at the logic one state.

The logic one at the Q output of Flip-Flop 109 is supplied to the clear inputs of Flip-Flops 89, 93 and 101. The system clock signal of FIG. 3 then toggles Flip-Flop 89 which toggles Flip-Flip 93 which toggles Flip-Flip 101 until the Q outputs of Flip-Flops 89, 93 and 101 are each at the logic one state resulting in logic ones being provided to each input of NAND gate 103. The output of NAND gate 103 will transition to the logic zero state causing Flip-Flip 109 to be reset such that the Q output of Flip-Flop 109 will transition to the logic zero state. This logic zero is supplied to the second input of OR gate 105 causing its output to transition to the logic zero state and remain at the logic zero state until another SI pulse of the SI signal of FIG. 3 is supplied to the clock input of Flip-Flop 109. The logic zero at the Q output of Flip-Flop 109 is also supplied to the clear inputs of Flip-Flops 89, 93 and 101 clearing these Flip-Flops which results in a logic one at the output of NAND gate 103 which is supplied to the clear input of Flip-Flop 109.

It should be noted Flip-Flops 89, 93 and 101 are configured to function as a three bit binary counter with each Q output being at the logic one state after a count of eight, that is eight pulses of the system clock signal of FIG. 3.

The signal occurring at the output of OR gate 105 is supplied through the CLK output of circuit 51 to the input of an inverter 111 which inverts the signal resulting in the CLK signal of FIG. 3.

Referring to FIGS. 1, 2, 3, 7a and 7b, when the CLRN signal of FIG. 3 is at the logic zero state, Flip-Flop 167 is cleared resulting in a logic zero at the Q output of Flip-Flop 167 disabling AND gate 169. The logic zero occurring at the CLRN input of down counter 113 is also supplied to an inverter 165 which inverts the logic zero to a logic one which is next supplied through a OR gate 159 to the first inputs of NAND gates 161, 153, 151, 147, 145, 139, 135, 133, 129, 127 and 125 enabling NAND gates 161, 153, 151, 147, 145, 139, 135, 133, 129, 127 and 125. For the timing waveforms illustrated by FIG. 3 logic zeros are provided to the D0, D2, D3 and D4 inputs of down counter 113 and a logic one is provided to the D1 input of down counter 113.

Since the D4 input of down counter 113 is at the logic zero state the logic one occurring at the output of inverter 155 will be supplied to the second input of NAND gate 161 resulting in a logic zero at the output of NAND gate 161. The logic zero is supplied to the clear inputs of Flip-Flops 241 and 243 resetting these Flip-Flops such that their Q outputs are at the logic zero state. Since the D3 input of down counter 113 is at the logic zero state a logic one is provided at the output of inverter 149 which is supplied to the second input of NAND 151 resulting in a logic zero at the output of NAND gate 151. The logic zero is then supplied to the clear inputs of Flip-Flops 237 and 239 resetting these Flip-Flops such that their Q outputs are at the logic zero state.

Since the D2 input of down counter 113 is at the logic zero state a logic one is provided at the output of inverter 143 which is supplied to the second input of NAND 145 resulting in a logic zero at the output of NAND gate 145. The logic zero is then supplied to the clear inputs of Flip-Flops 233 and 235 resetting these Flip-Flops such that their Q outputs are at the logic zero state.

The logic one occurring at the D1 input of down counter 113 is inverted through NAND gate 135 to a logic zero and supplied to the preset inputs of Flip-Flops 229 and 231 resulting in the Q outputs of these Flip-Flops being set to the logic one state. The Q outputs of Flip-Flops 221, 223, 225 and 227 are similarly set to the logic zero state by the logic zero portion of the CLRN signal of FIG. 3.

After the CLRN signal transitions to the logic one state, down counter 113 will become operational with the Q outputs of Flip-Flops 243, 239, 235, 231, 227 and 223 being respectively 0,0,0,1,0,0. The INV_CLK signal (inverted clock) of FIG. 3 will then cause down counter 133 to begin its down count. Down counter 113 will continue its down count until the Q outputs of Flip-Flops 243, 239, 235, 231, 227 and 223 are respectively 0,0,0,0,0,1. The logic one at the Q output of Flip-Flop 223 is then supplied to inverter 171 which inverts the logic one to a logic zero. Since the Q outputs of Flip-Flops 243, 239, 235, 231 and 227 are now at the logic zero state and the output of inverter 171 is a logic zero each input to NOR gate 247 is a logic zero resulting in logic zero to one transition at the output of NOR gate 247 (identified as the 24.CLK signal of FIG. 3). The logic one from NOR gate 247 is supplied through the LOAD input of down counter 113 to AND gate 157 enabling AND gate 157 allowing the logic one portion of the INV_CLK signal of FIG. 3 to pass through AND gate 157 and OR gate 159 to the first inputs of NAND gates 161, 153, 151, 147, 145, 139, 135, 133, 129, 127 and 125 again enabling NAND gates 161, 153, 151, 147, 145, 139, 135, 133, 129, 127 and 125. Enabling NAND gates 161, 153, 151, 147, 145, 139, 135, 133, 129, 127 and 125 allows another five bit word from three to eight decoder 53 to be loaded into the Flip-Flops of down counter 113.

When the output of NOR gate 247 transitions from the logic zero state to the logic one state, the logic one at the D input of Flip-Flop 255 is clocked to its Q output and then supplied to the first input of an AND gate 257 enabling AND gate 257. This allows the SI signal of FIG. 3 to pass through AND gate 257 to the SO output of circuit 29 which results in the SO signal of FIG. 3 being provided at the SO output of circuit 29.

As is best illustrated by the timing waveforms of FIG. 3, there is a delay of four pulses of the INV_CLK signal of FIG. 3 between the generation of the first SI pulse and the generation of the first SO pulse. This is the result of the three to eight decoder 53 providing a count of four to down counter 113.

Figure 8:
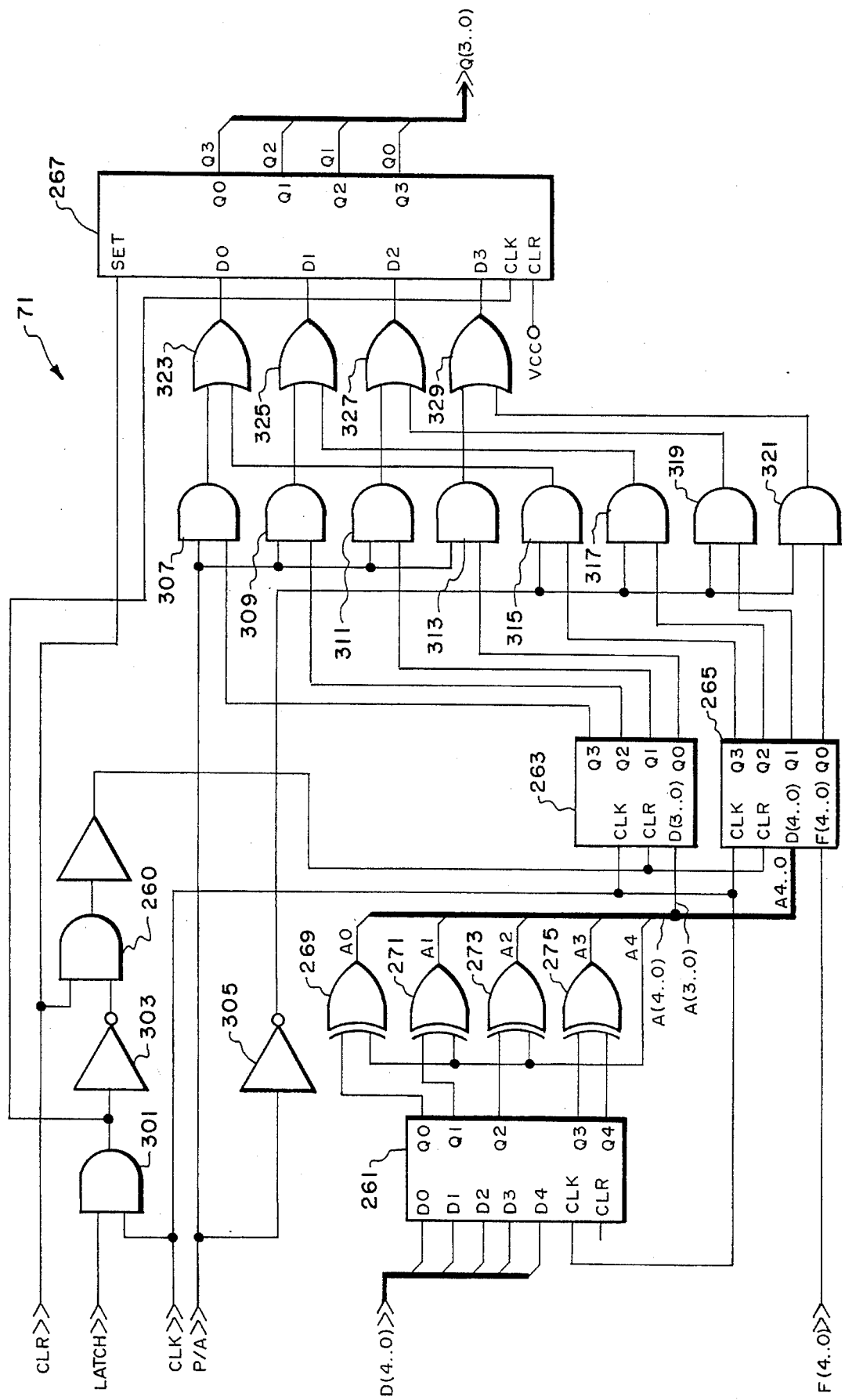
FIG. 8 is a detailed logic diagram of the gain circuit of the circuit of FIG. 2.
Figure 9:
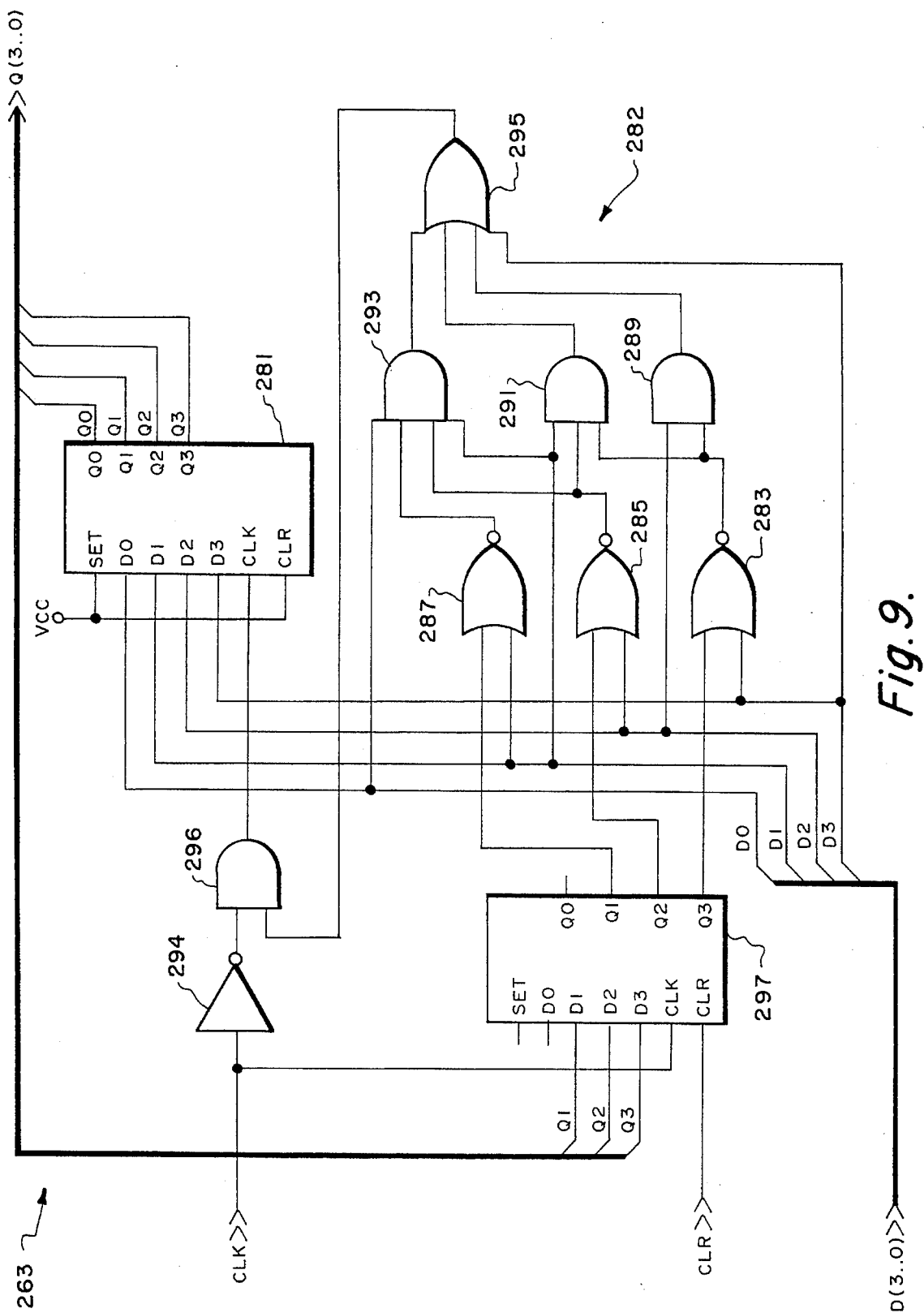
FIG. 9 is a detailed logic diagram of the peak detector circuit of the circuit of FIG. 8.
Figure 10:
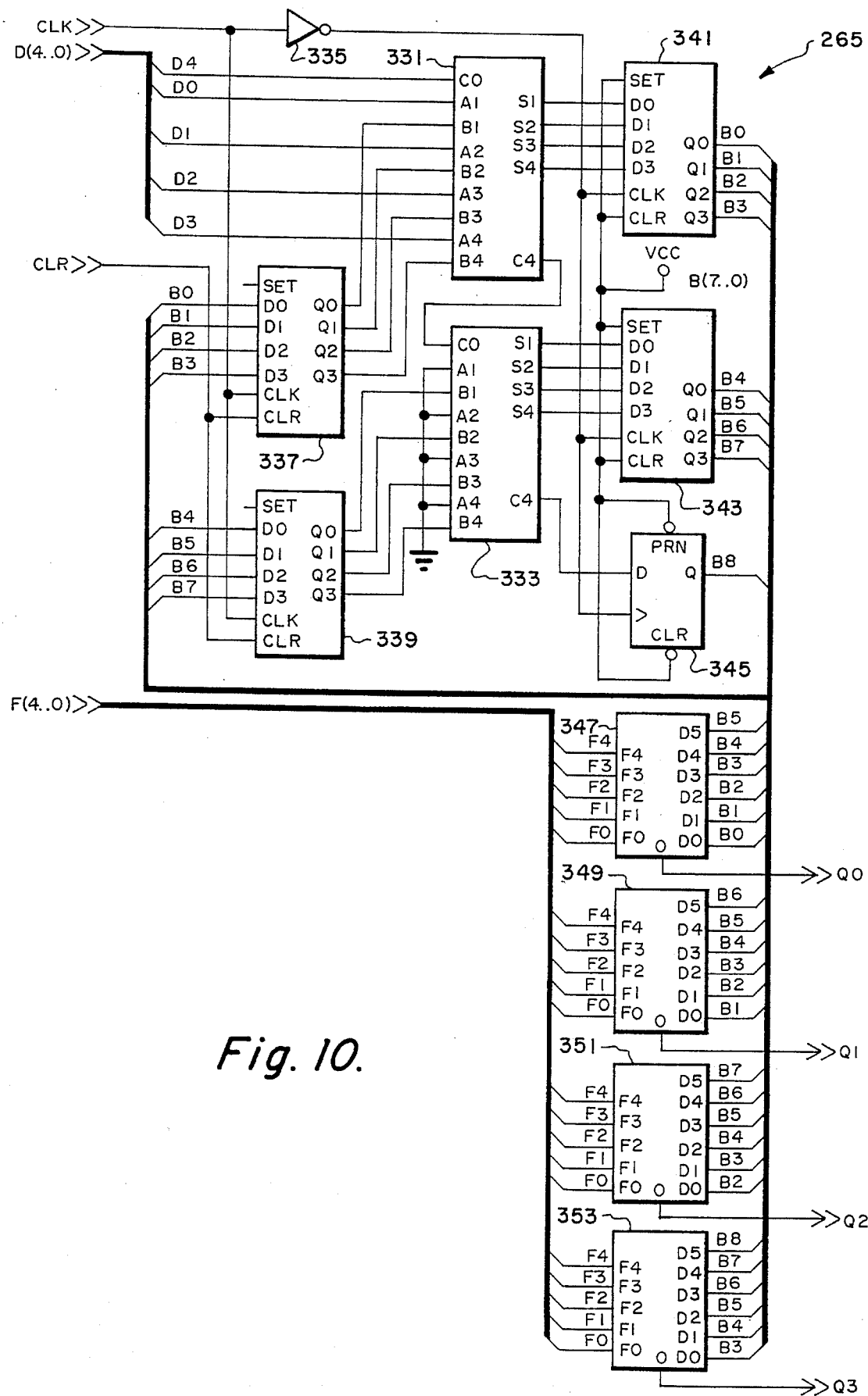
FIG. 10 is a detailed logic diagram of the averaging circuit of the circuit of FIG. 8.
Figure 11:
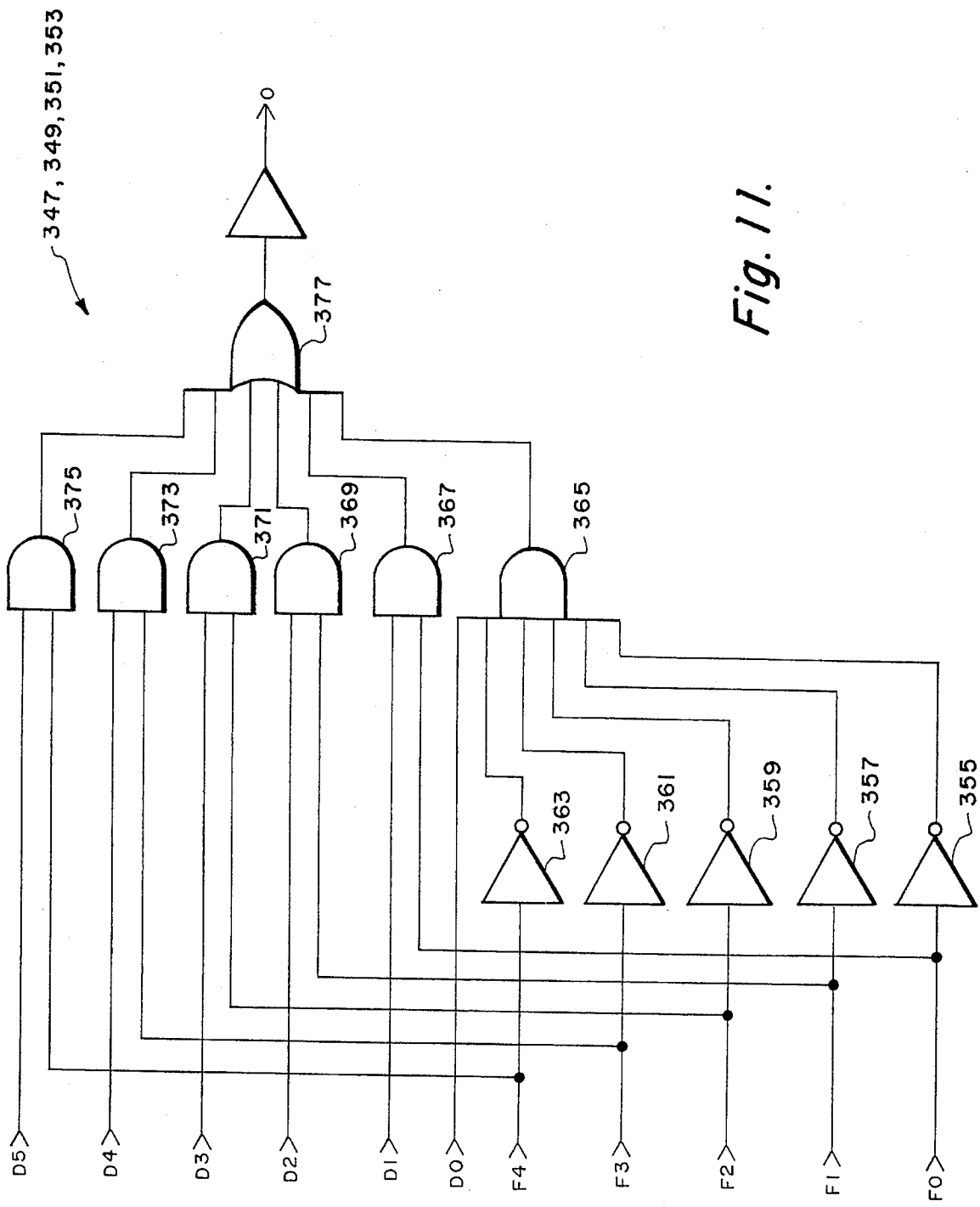
FIG. 11 is a detailed logic diagram of the filter select circuits of the circuit of FIG. 8.
Figure 12:
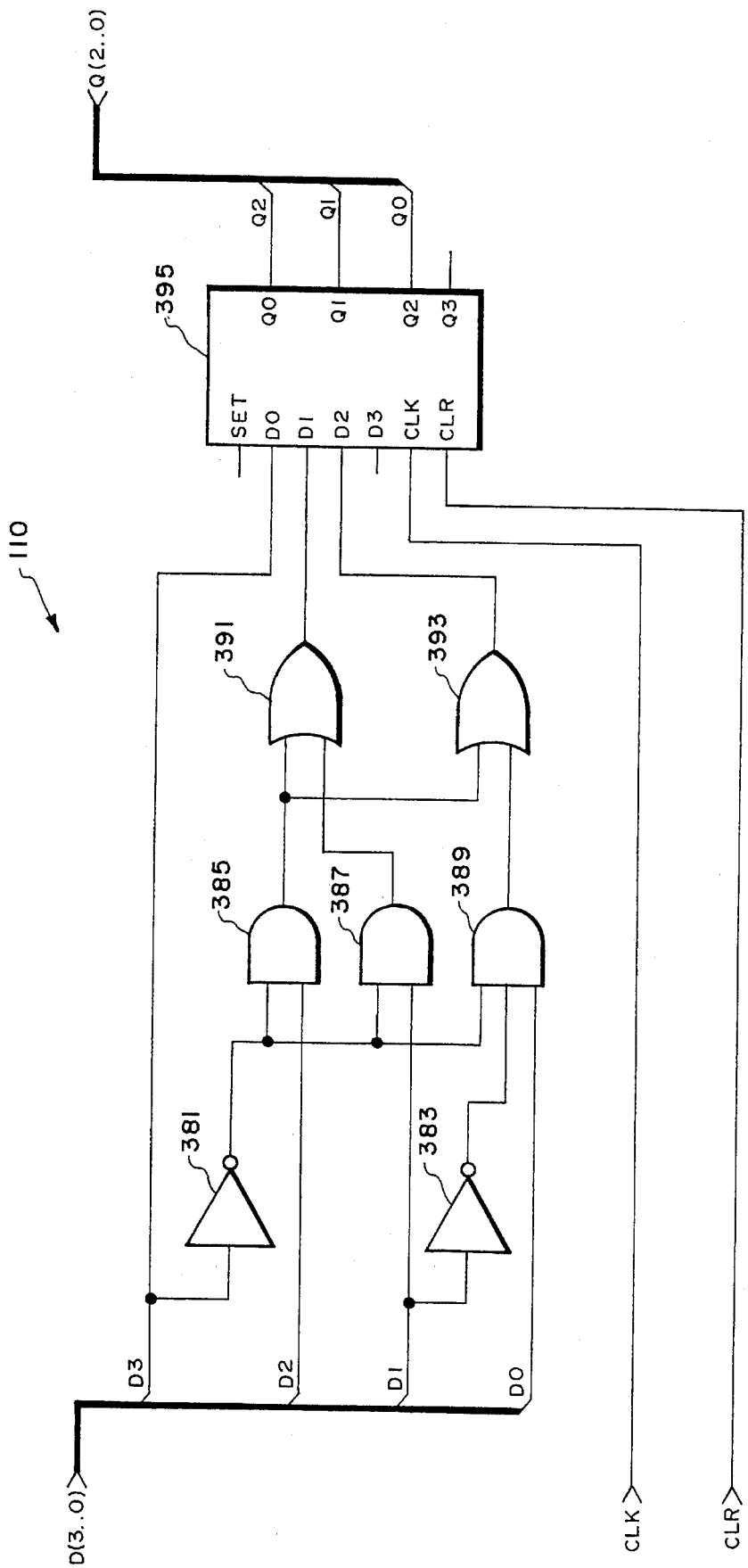
FIG. 12 is a detailed logic diagram of the gain encoder of the circuit of FIG. 2.
Figure 13:
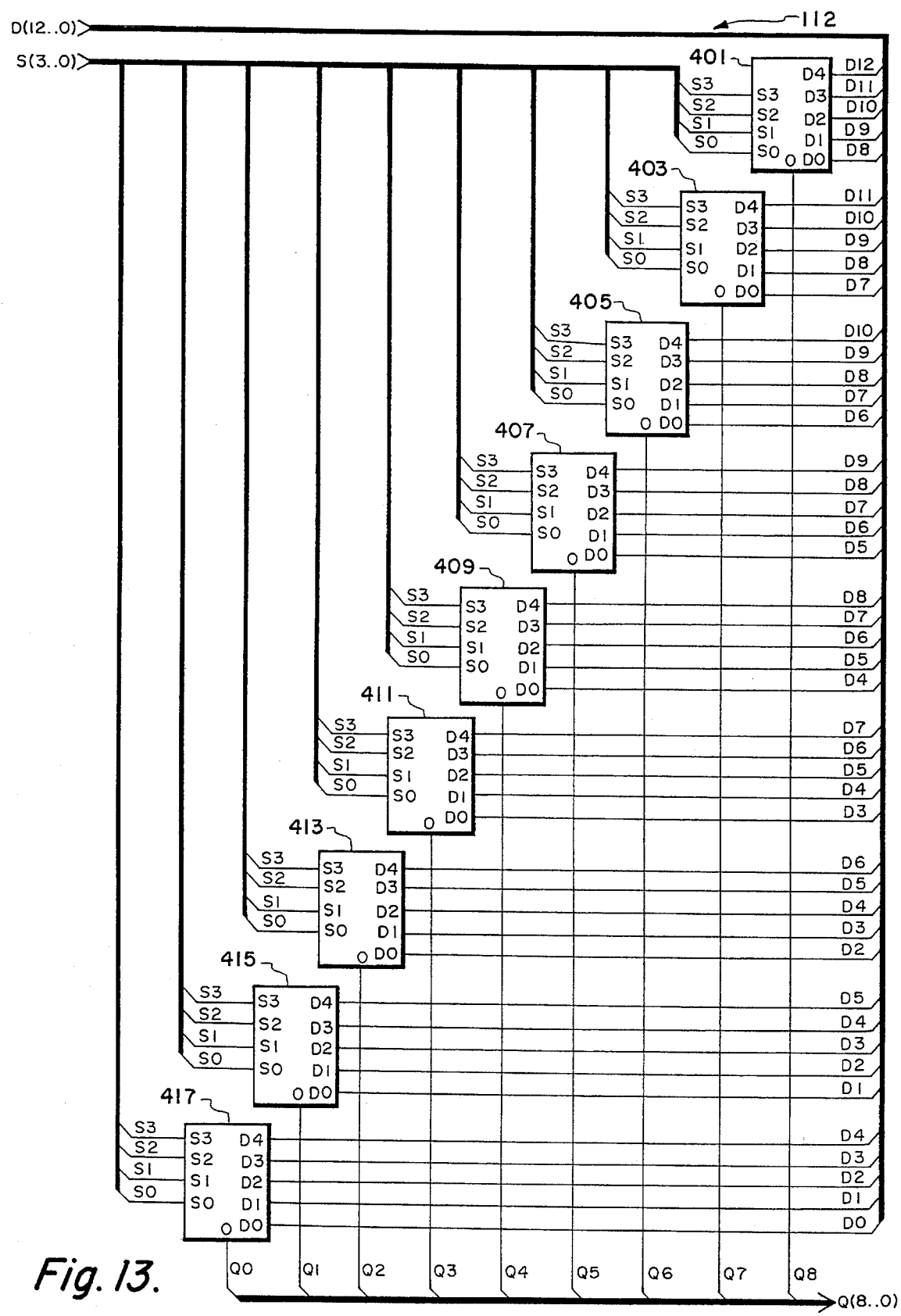
FIG. 13 is a detailed logic of the data selector circuit of the circuit of FIG. 2.

Referring to FIGS. 1, 2 and 8 the logic zero portion of the CLRN signal of FIG. 3 is provided through the clear input of a gain circuit and an AND gate 260 to the clear inputs of a peak detector circuit 263, an averaging circuit 265 and the preset input of a four bit latch. This logic zero clears peak detecting circuit 263 and averaging circuit 265. This logic zero signal also presets the Q0–Q3 outputs of circuit 267 to the logic one state.

The five most significant bits of each digital sample of the incoming analog signal are provided to gain circuit 71 after each digital sample is converted to a parallel format by serial to parallel converter 41. These five bits FI13 through FI9 include a sign bit FI13 and four data bits FI12, FI11, FI10 and FI9. When the sign bit is at the logic one state the digital equivalent signal is negative and in twos complement form and when the sign bit is at the logic zero state the digital equivalent signal is positive.

The sign bit is first provided to the D4 input of a five bit latch 261, while the four data bits FI12, FI11, FI10 and FI9 are provided respectively to the D3, D2, D1 and D0 inputs of five bit latch 261. The logic zero to one transitions of the INV_CLK (inverted clock) signal of FIG. 3 latch the four data bits FI12, FI11, FI10 and FI9 and sign bit FI13 of each digital sample into latch 261. The sign bit FI13 is supplied to the first inputs of EXCLUSIVE-OR gates 269, 271, 273 and 275, while the data bits FI9, FI10, FI11 and FI12 are provided respectively to the second inputs of EXCLUSIVE-OR gates 269, 271, 273 and 275. When the sign bit FI13 is one indicating a negative number each data bit FI9, FI10, FI11 and FI12 is inverted by EXCLUSIVE-OR gates 269, 271, 273 and 275. When the sign bit FI13 is zero indicating a positive number each data bit FI9, FI10, FI11 and FI12 remains at the same logic state when passing through EXCLUSIVE-OR gates 269, 271, 273 and 275.

Referring to FIGS. 1, 2, 3, 8 and 9, there is shown the peak detector circuit 263 which includes a latch 281 and latch 297 as well as a comparison circuit 282 having three NOR gate 283, 285 and 287; AND gates 289, 291 and 293 and OR gate 295. When the first digital sample of four digital samples is supplied to circuit 263, comparison circuit 282 will provide a logic one at the output of OR gate 295. For example, when the bits FI9, FI10, FI11 and FI12 are respectively 0,1,0,0 a logic one is provided to the first input of AND gate 291 and logic zeros are provided to the first inputs of NOR gates 283 and 285. Since the Q2 and Q3 outputs of latch 297 are at the logic zero state the outputs of NOR gates 283 and 285 are logic ones resulting in logic ones to the second and third inputs of AND gate 291. The output of AND gate 291 is now at the logic one state resulting in logic one at the output of OR gate 295 which is provided to the first input of AND gate 296 enabling AND gate 296. Since inverter 294 inverts the INV_CLK signal, the signal provided through AND gate 296 to the clock input of latch 281 is identical to the CLK waveform illustrated in FIG. 3. The leading edge of this signal will latch bits FI9, FI10, FI11 and FI12 into latch 281.

The leading edge of the INV_CLK signal of FIG. 3 will next latch the three most significant bits FI10, FI11 and FI12 into latch 297 so that the Q1, Q2 and Q3 outputs of latch 297 are respectively 1,0,0.

If the second digital sample provided to circuit 263 has bits 0,0,1,0 then logic zeros are provided to the first and second inputs of NOR gate 283 resulting in a logic one at its output. Since the D2 line of circuit 263 is also at the logic one state, logic ones are being supplied to each of the inputs of AND gate 289 resulting in a logic one at its output which is then supplied through OR gate 295 to the first input of AND gate 296 again enabling AND gate 296.

Bits 0,0,1,0 are first latched into latch 281 by the CLK signal of FIG. 3 and then bits 0,1,0 are latched into latch 297 by the INV_CLK signal of FIG. 3.

If the third and fourth digital samples are 0,1,0,0 then outputs of NOR gates 285 and 287 will be logic zeros, the output of NOR gate 283 will be a logic one and the outputs of AND gates 289, 291 and 293 will be logic zeros resulting in a logic zero at the output of OR gate 295. This logic zero is next supplied to the first input of AND gate 296 inhibiting AND gate 296 which prevents the CLK signal from passing through AND gate 296 to the CLK input of latch 281.

Since the P/A input to gain circuit 71 is at the logic one state AND gates 307, 309, 311 and 313 are enabled allowing bits FI9, FI10, FI11 and FI12 which are respectively 0,0,1,0 to pass through these gates and then through OR gates 323, 325, 327 and 329 to the D0, D1, D2 and D3 inputs of latch 267. While the 24.CLK signal of FIG. 3 is at the logic one state, the logic zero to one transition of INV_CLK signal will latch the bits 0,0,1,0 to the Q0, Q1, Q2 and Q1 outputs of latch 267 and then to an encoder circuit 110 and a data selector circuit 112.

Referring to FIGS. 1, 2, 3, 8, 10 and 11, the four digital samples are averaged by circuit 265 for the waveforms of FIG. 3. The logic zero portion of the clear signal of FIG. 3 first clears four bit latches 337 and 339.

When the first sample of the four bits FI9, FI10, FI11 and FI12 are respectively 0,1,0,0 and bit FI13 is a logic zero indicating that the sample is positive, the sample will pass directly through four bit adder 331 to the D0–D3 inputs of latch 341. Since inverter 335 inverts the INV_CLK signal of FIG. 3 the signal provided to the clock input of latches 343 and 345 is identical to the CLK waveform illustrated in FIG. 3. This CLK signal will first clock the bits 0,1,0,0 into latch 341. Bits 0,1,0,0 are next provided to the D0–D3 input of latch 337 and clocked therein by the leading edge of the INV_CLK signal of FIG. 3.

If the second digital sample provided to circuit 265 has bits 0,0,1,0 the resultant 4 bit signal provided at the S1, S2, S3 and S4 outputs of adder 331 is respectively 0,1,1,0 with this signal being clocked into latch 341 by the CLK signal of FIG. 3. The INV_CLK signal of FIG. 3 will then latch the bits 0,1,1,0 into latch 337.

In a like manner when the third digital sample has bits 0,0,0,1 the resultant 4 bit signal provided at the S1, S2, S3 and S4 outputs of adder 331 is respectively 0,1,1,1 with this signal being clocked into latch 341 by the CLK signal of FIG. 3. The INV_CLK signal of FIG. 3 will then latch the bits 0,1,1,1 into latch 337.

When the fourth digital sample 1,0,0,1 the resultant 4 bit signal provided at the S1, S2, S3 and S4 outputs of adder 331 is respectively 1,1,1,0 with this signal being clocked into latch 341 by the CLK signal of FIG. 3. In addition, there is provided at the C4 output of latch a logic one carry bit which is C0 input of 4 bit adder resulting in a logic one at the S1 output of adder 333 and logic zeros at the S2, S3 and S4 outputs of adder 333. This 4 bit signal, that is 1,0,0,0 occurring respectively at the S1, S2, S3 and S4 outputs of adder 333, is latched into latch 343 by the CLK signal of FIG. 3. The INV_CLK signal will next latch the 1,1,1,0 from latch 341 and the 1,0,0,0 from latch 343 respectively into latches 337 and 339.

After the sum of the four digital samples is latched into latches 341 and 343 the bits occurring on data lines B0, B1, B2, B3, B4, B5, B6, B7 and B8 are respectively 1,1,1,0,1, 0,0,0,0. These bits are provided to a filter select system consisting of four filter select circuits 347, 349, 351 and 353. Thus, logic ones are provided to inputs D0–D2 and D4 of filter select circuit 347; logic ones are provided to the inputs D0, D1 and D3 of filter select circuit 349; logic ones are provided to the D0 and D2 inputs of filter select circuit 351 and logic one is provided to the D1 input of filter select circuit 353.

Since three to eight decoder 53 provided a logic one to the F1 input of gain circuit 71 a logic one is provided to the first input of AND gate 369 enabling only AND gate 369 of each of the filter select circuits 347, 349, 351 and 353 is enabled. This allows the logic ones provided to the D2 inputs of filter select circuits 347 and 351 to pass through AND gate 369 and OR gate 377 of filter select circuits 347 and 351. Thus the Q0, Q1, Q2 and Q3 outputs of circuit 265 will be respectively 1,0,1,0.

This 4 bit 1,0,1,0 signal is then provided to AND gates 315, 317, 319 and 321 and will pass through these gates and then through OR gates 323, 325, 327 and 329 to the Q0, Q1, Q2 and Q3 inputs of latch 267 when the P/A input to gain circuit 71 is at the logic zero state. While the 24.CLK signal of FIG. 3 is at the logic one state, the logic zero to one transition of INV_CLK signal will latch the bits 1,0,1,0 to the Q0, Q1, Q2 and Q3 outputs of latch 267 and then to a gain encoder circuit 110 and a data selector circuit 112.

It should be noted that when the 24.CLK signal of FIG. 3 is at the logic one state, the logic zero to one transition of INV_CLK signal of FIG. 3 will result in a logic zero at the output of inverter 303 which is then supplied through _AND gate 260 to the CLR inputs of peak detector circuit 263 and averaging circuit 265. This logic zero clears latch 297 of peak detector circuit 263 and latches 337 and 339 of averaging circuit 265 allowing either peak detector circuit 263 or averaging circuit 265 to process another four digital samples provided to gain circuit 71.

Figure 5:
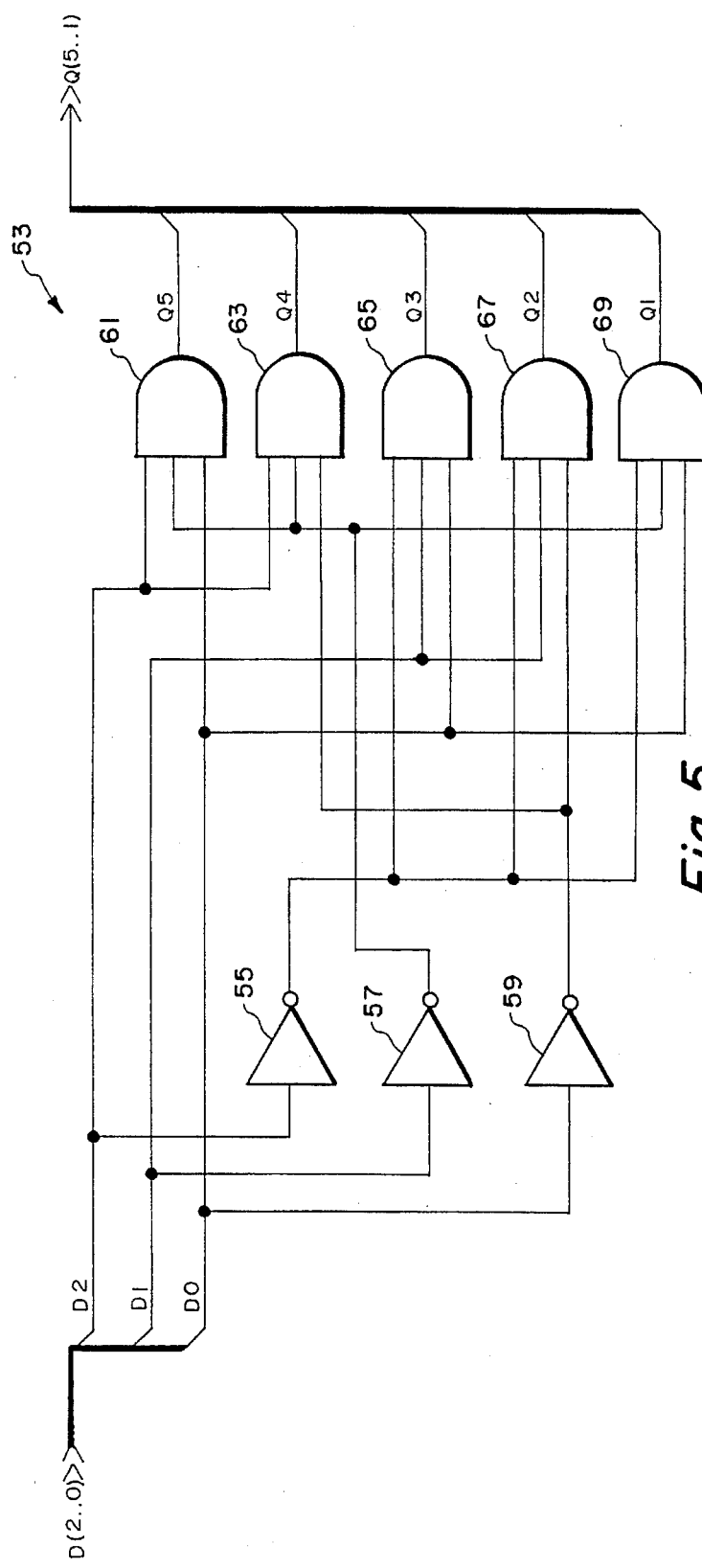
FIG. 5 is a detailed logic diagram of the three to eight decoder of the circuit of FIG. 2.
Figure 6:
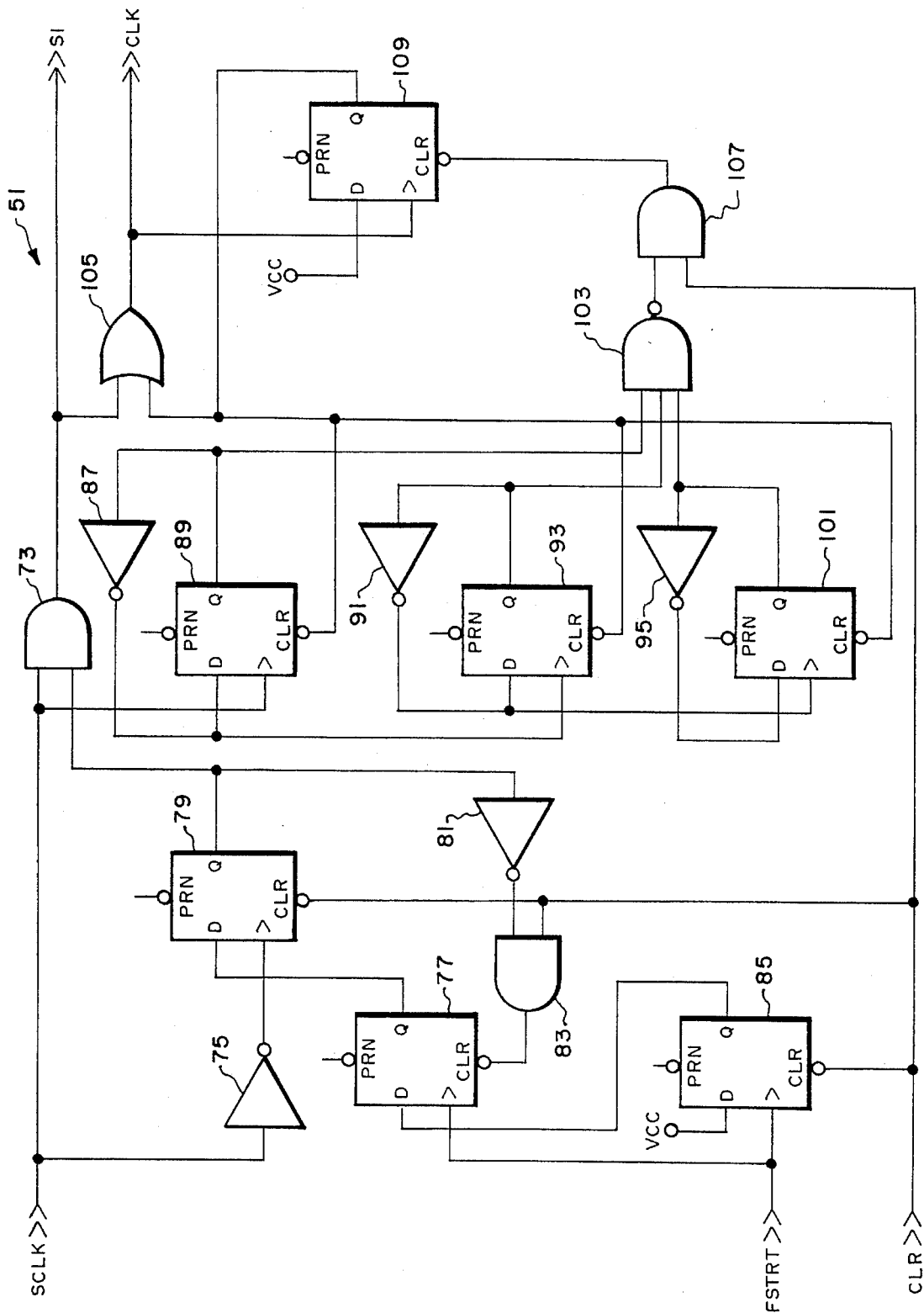
FIG. 6 is a detailed logic diagram of the clock generating circuit of the circuit of FIG. 2.
Figure 7A:
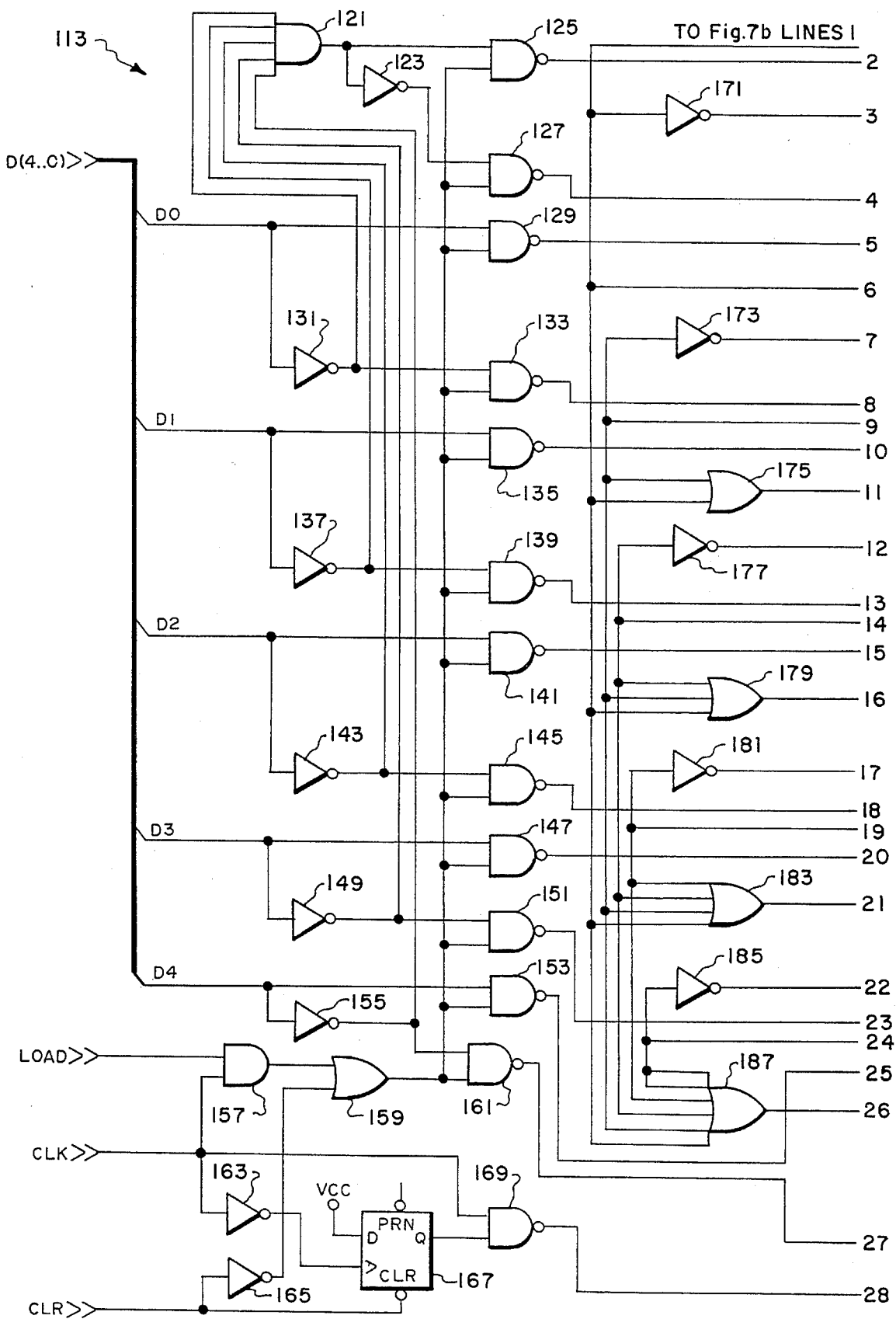
FIGS. 7a and 7b is a detailed logic diagram of the down counter of the circuit of FIG. 2.
Figure 7B:
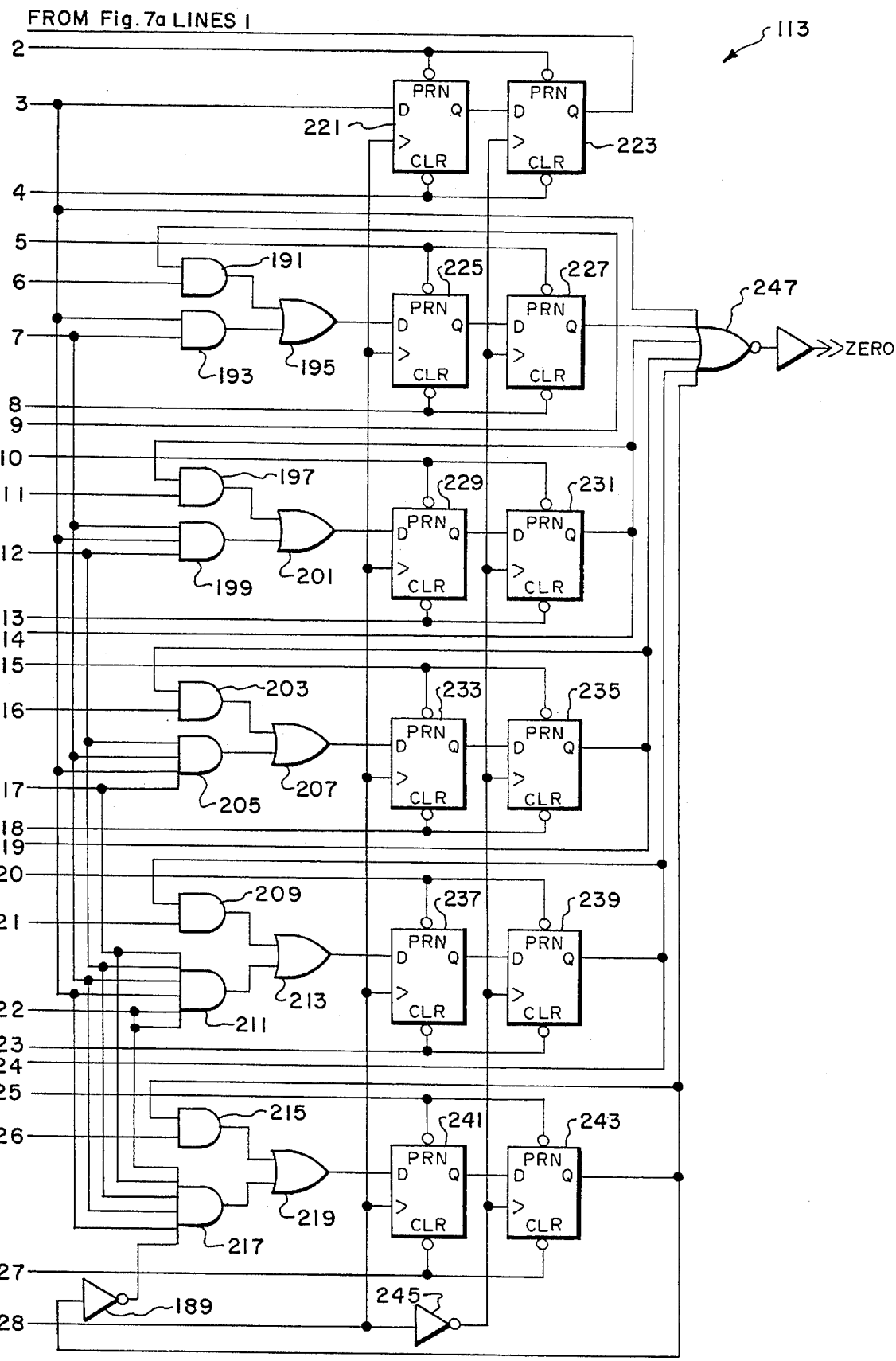

It should be noted that a logic one at the output of AND gate 69 of decoder circuit 53, FIG. 5, results in two digital samples being be processed by gain control circuit 71; a logic one at the output of AND gate 67 results in four digital samples being processed by gain control circuit 71; a logic one at the output of AND gate 65 results in eight digital samples being processed by gain control circuit 71; a logic one at the output of AND gate 63 results in eight digital samples being processed by gain control circuit 71 and a logic one at the output of AND gate 63 results in thirty two digital samples being processed by gain control circuit 71.

Referring to FIGS. 1, 2, 3, 8 and 12, there is shown gain encoder circuit 110 which encodes the four bits from latch 267 of gain circuit 71. At this time it should be noted that the waveforms of FIG. 3 illustrate the processing of an equivalent fourteen bit digital signal when the P/A signal is at the logic zero state.

Thus, when the Q0, Q1, Q2 and Q3 outputs of latch 267 are respectively 1,0,1,0 the outputs of AND gates 385 and 389 are set at the logic one state resulting in logic ones being provided to the D1 and D2 inputs of latch 395 and a logic zero to the D0 input of latch 395. The INV_CLK signal of FIG. 3 then clocks the logic ones to the Q1 and Q2 outputs of latch 395 and the logic zero to the Q0 output of latch 395. This, in turn, results in the Q2, Q1 and Q0 outputs of encoder circuit 110 being 0,1,1.

The following table illustrates the Q0, Q1 and Q2 outputs provided by encoder circuit 110 for each 4 Bit signal provided to encoder circuit 110.

TABLE I

| INPUTS | | | | OUTPUTS | | | X = DON'T |
|---|---|---|---|---|---|---|---|
| D3 | D2 | D1 | D0 | Q2 | Q1 | Q0 | CARE |
| 1 | X | X | X | 1 | 0 | 0 | |
| 0 | 1 | X | X | 0 | 1 | 1 | |
| 0 | 0 | 1 | X | 0 | 1 | 0 | |
| 0 | 0 | 0 | 1 | 0 | 0 | 1 | |
| 0 | 0 | 0 | 0 | 0 | 0 | 0 | |

When, for example, the Q2, Q1 and Q0 outputs of encoder circuit 110 are respectively 1,0,0 then the gain is four and the eight bits with dither added thereto of the fourteen bit equivalent signal being provided by circuit 29 are bits FI13-FI6. Similarly, when the Q2, Q1 and Q0 outputs of encoder circuit 110 are respectively 0,1,1 then the gain is three and the eight bits with dither added thereto of the fourteen bit equivalent signal being provided by circuit 29 are bits FI13, FI11-FI5. When the Q2, Q1 and Q0 outputs of encoder circuit 110 are respectively 0,1,0 then the gain is two and the eight bits with dither added thereto of the fourteen bit equivalent signal being provided by circuit 29 are bits FI13, FI10-FI4. When the Q2, Q1 and Q0 outputs of encoder circuit 110 are respectively 0,0,1 then the gain is one and the eight bits with dither added thereto of the fourteen bit equivalent signal being provided by circuit 29 are bits FI13, FI9-FI3. When the Q2, Q1 and Q0 outputs of encoder circuit 110 are respectively 0,0,0 then the gain is one and the eight bits with dither added thereto of the fourteen bit equivalent signal being provided by circuit 29 are bits FI13, FI8-FI2.

Referring to FIGS. 1, 2, 3, 13 and 14 as is best illustrated by FIG. 3, the first digital equivalent signal provided to the FO(13 . . . 0) input of circuit 29 has a hexadecimal value 0A2A which, in turn, is binary 0,0,1,0,1,0,0,0,1,0,1,0,1,0. The gain from encoder circuit 110 is four as shown in FIG. 3 which in accordance with TABLE I requires that only the S3 input to bit selector circuits 401-417 be set at the logic one state. For the purpose of illustration bits S2, S1 and S0 may be respectively 0,0,0.

Figure 14:
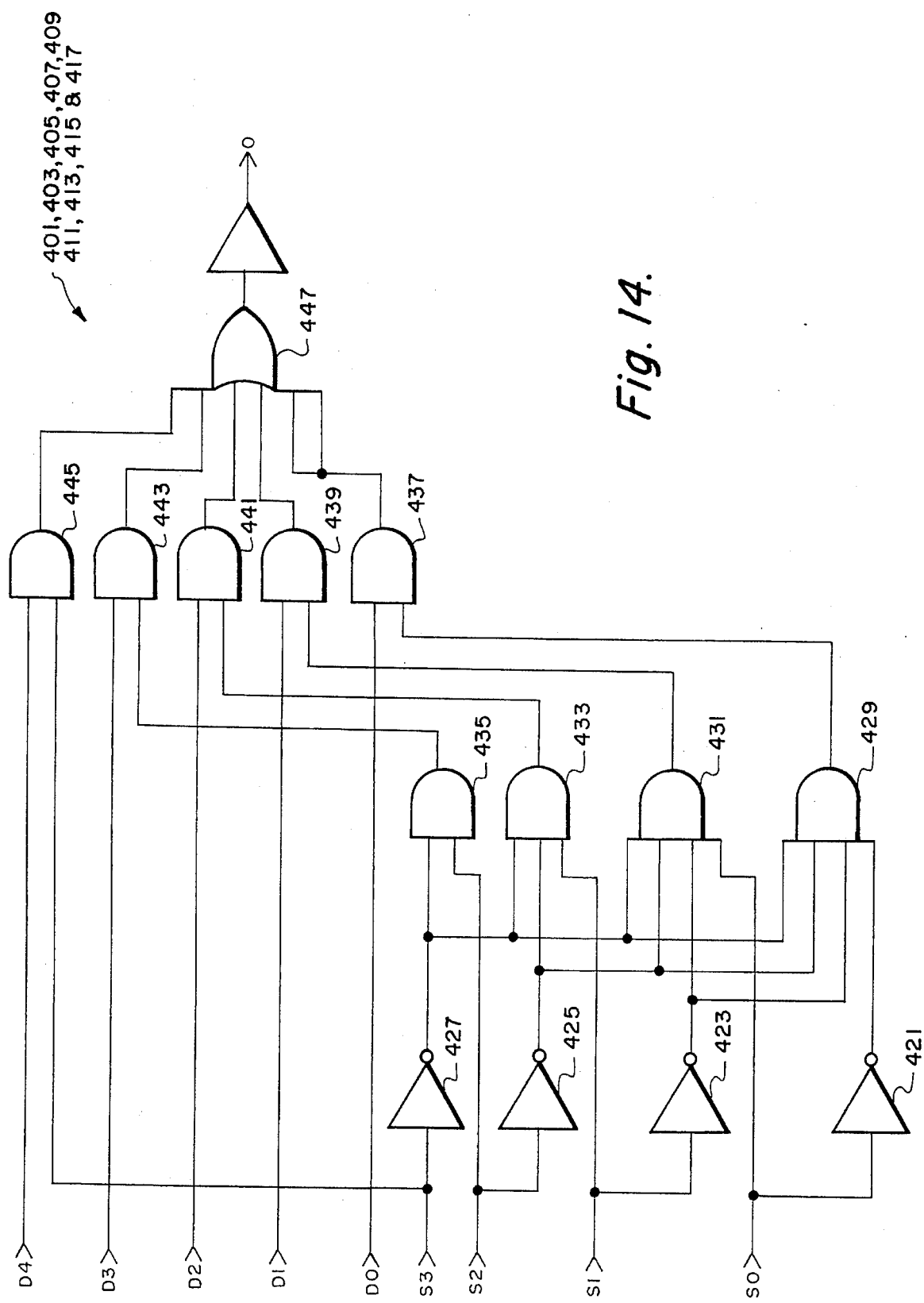
FIG. 14 is a detailed logic diagram of the bit selector circuits of the circuit of FIG. 13.
Figure 15:
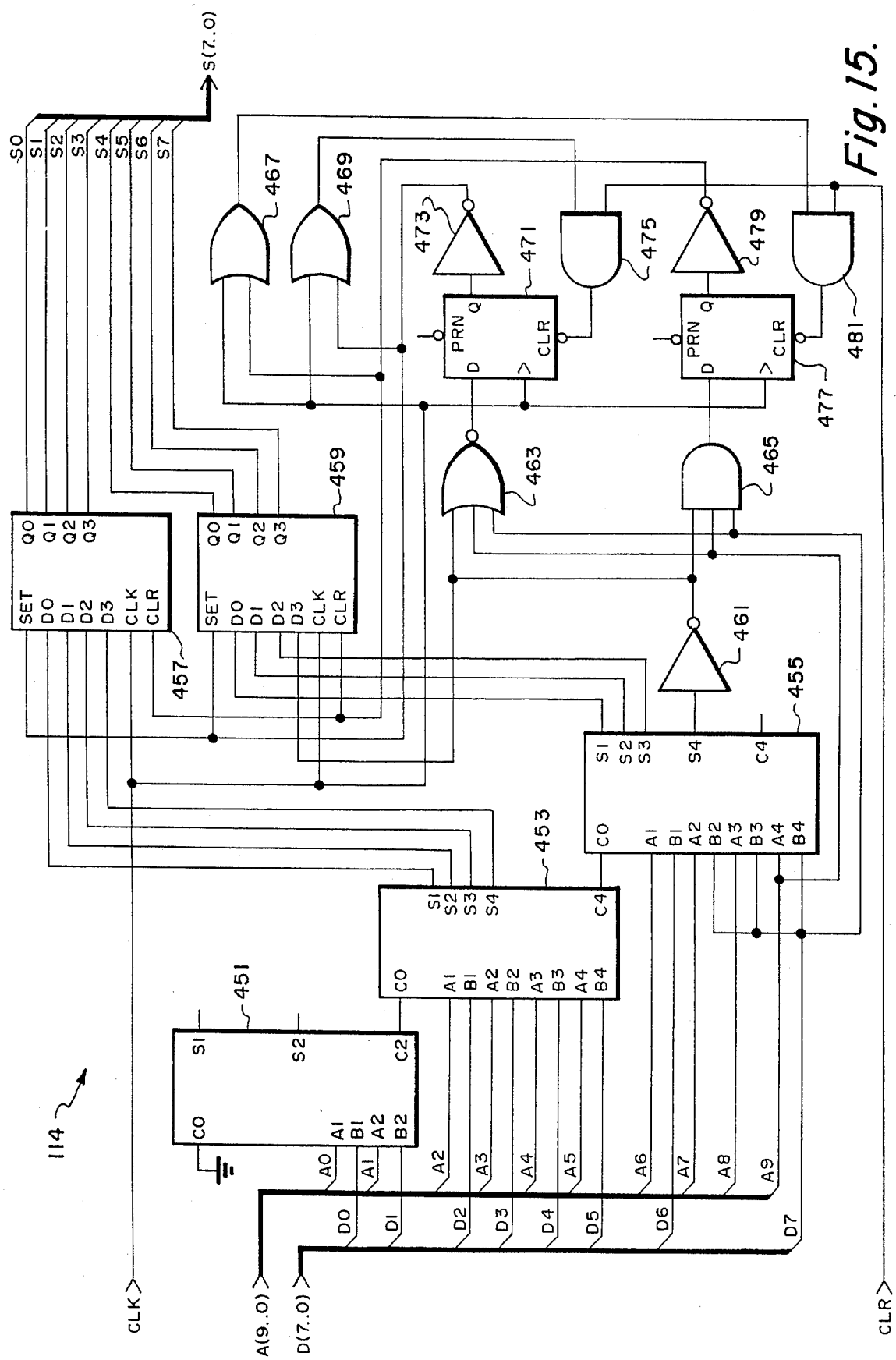
FIG. 15 is a detailed logic diagram of the dither adder circuit of the circuit of FIG. 2.

Referring to FIG. 14 the logic one occurring at the S3 input of each bit selector circuit is supplied to the first input of AND gate 445 enabling AND gate 445. This logic one is also supplied to inverter 427 which inverts the logic one to a logic zero resulting logic zeros being provided to the first inputs of AND gates 429, 431, 433 and 435. The outputs of AND gates 429, 431, 433 and 435 are now at the logic zero state resulting in logic zeros being provided at the first inputs of AND gates 437, 439, 441 and 443 inhibiting AND gates 437, 439, 441 and 443. Accordingly the only bit that will pass through each of the bit selector circuits 401-417 is the bit supplied to the D4 input of each bit selector circuit 401-417.

Referring to FIGS. 1, 2, 3, 13 and 14, since the first digital equivalent signal provided to the D(12 . . . 0) inputs of circuit 112 is binary 0,1,0,1,0,0,0,1,0,1,0,1,0, and only AND gate 445 of each of the bit selector circuits is enabled the binary bits 0,1,0,1,0,0,0,1,0 will pass through bit selector circuits 401-417 respectively to the Q9, Q8, Q7, Q6, Q5, Q4, Q3, Q2 and Q1 outputs of circuit 112. As is best illustrated by FIG. 3 the hexadecimal equivalent of this 0A2 (identified as the ATA_SEL_OUT signal of FIG. 3).

Referring to FIGS. 1, 2, 3 and 15, the first eight bit digital equivalent signal provided to A(9 . . . 0) inputs of dither adder circuit 114 includes the 0A2 signal from data selector circuit 112 and the logic zero sign bit. The logic zero sign bit is supplied to the A9 input of dither adder circuit 114 and the nine data bits 0,1,0,1,0,0,0,1,0 which are supplied respectively to the A8, A7, A6, A5, A4, A3, A2, A1 and A0 inputs of circuit 114. The dither component added to this signal is one (identified as D(7 . . . 0) in FIG. 3) meaning that only the D0 input to dither adder circuit 114 is at the logic one state.

Adders 451, 453 and 455 next add the dither component to the ten bit digital equivalent signal. This results in the S1 and S2 outputs of adder 451 being logic ones, the S1, S2, S3 and S4 outputs of adder 453 being respectively 0,0,0,1 and the S1, S2, S3 and S4 outputs of adder 455 being respectively 0,1,0,0. The 0,0,0,1 from adder 453 is supplied respectively to the D0, D1, D2 and D3 inputs of latch 457 while the 0,1,0 from adder 455 is supplied respectively to the D0, D1 and D2 inputs of latch 459. The logic zero from the S4 output of adder 445 is supplied to inverter 461 which inverts the logic zero to a logic one which is then supplied to the D3 input of latch 459. The INV_CLK signal of FIG. 3 will then clock the bits 0,0,0,1 through latch 457 and the bits 0,1,0,1 through latch 459 resulting in an eight bit hexadecimal A8 equivalent signal at the S(7 . . . 0) output of circuit 114. This, in turn, is the DD(7 . . . 0) signal of FIG. 3.

Dither adder circuit 114 also provides for an overflow condition wherein each bit occurring at the Q0–Q4 outputs of latches 457 and 459 is a logic one and an underflow condition wherein each bit occurring at the Q0–Q4 outputs of latches 457 and 459 is a logic zero.

An overflow condition occurs whenever the sign bits A9 and D7 are both logic zeros indicating that the dither component and the eight bit equivalent signal are positive and the S4 output of adder 455 is at the logic one state. The logic one is next provided to inverter 461 which inverts the logic one to a logic zero resulting in logic zeros at each input of NOR gate 463. NOR gate 463 then provides a logic one to the D input of Flip-Flop 471 which is clocked through Flip-Flop 471 to the input of inverter 473 by the INV_CLK signal of FIG. 3. This logic one is next inverted to a logic zero by inverter 473 resulting in a logic zero being provided to the SET inputs of latches 457 and 459 which presets each output Q0–Q4 of latches 457 and 459 to the logic one state.

An underflow condition occurs whenever each input of AND gate 465 is at the logic one state. The sign bits A9 and D7 are both logic ones indicating that the dither component and the eight bit equivalent signal are negative and the S4 output of adder 455 is at the logic zero state. The logic zero is next provided to inverter 461 which inverts the logic zero to a logic one resulting in logic ones at each input of AND gate 465. AND gate 465 then provides a logic one to the D input of Flip-Flop 477 which is clocked through Flip-Flop 477 to the input of inverter 479 by the INV_CLK signal of FIG. 3. This logic one is next inverted to a logic zero by inverter 479 resulting in a logic zero being provided to the clear inputs of latches 457 and 459 which resets each output Q0–Q4 of latches 457 and 459 to the logic zero state.

While the present invention has been illustrated with the preferred embodiment, it is recognized that variations and changes may be made therein without departing from the invention as set forth in the claims.

What is claimed is:

1. A dithered analog-to-digital conversion circuit with gain control, comprising:

an analog to digital converter having an input for receiving an analog video signal, said analog to digital converter converting said analog video signal to an equivalent digital signal having a plurality of digital data samples, each of said digital data samples having thirteen data bits and a sign bit;

serial to parallel conversion means for receiving said digital equivalent signal and converting said digital equivalent signal from a serial form to a parallel form;

decoder means for receiving a first logic signal and decoding said first logic signal to provide a second logic signal;

clock signal generating means for receiving a system clock signal and a frame start signal, said clock signal generating means, responsive to said system clock signal and said frame start signal, generating a strobe data in signal and an internal clock signal;

a down counter coupled to said decoder means and said clock signal generating means for receiving said internal clock signal and said second logic signal, said down counter, responsive to said internal clock signal, counting down from a first binary number set within said down counter when said down counter receives and decodes said second logic signal;

said down counter providing a latch pulse when said binary counter counts down a second binary number;

a Flip-Flop having a data input for receiving a logic one signal, a clock input connected to said down counter for receiving said logic pulse and an output, said Flip-Flop, responsive to said latch pulse, latching to the output of said Flip-Flop said logic one signal;

gating means having a first input for receiving said logic one signal, a second input for receiving said data strobe in signal, and an output, said logic one signal enabling said AND gate allowing said data strobe in signal to pass through said gating means to provide at the output of said gating means a data strobe out signal;

a first-in, first-out memory coupled to said serial to parallel conversion means, said clock signal generating means and the output of said gating means, said first-in, first-out memory, responsive to said data strobe in signal, temporarily storing the digital data samples of said digital equivalent signal, said data strobe out signal effecting a retrieval of the digital data samples of said digital equivalent signal stored in said first-in, first-out memory;

gain control circuit means for receiving a first most significant data bit, a second most significant data bit, a third most significant data bit and a fourth most significant data bit of said digital data samples and said sign bit for each digital data sample;

said gain control circuit means calculating an average value of said first, second, third and fourth most significant bits for a predetermined number of digital data samples, said gain control circuit means generating a four bit logic signal indicative of said average value, said gain control circuit means allowing for the sign bit of each digital data sample when calculating the average value for said predetermined number of digital data samples said gain control circuit means receiving said latch pulse and being reset by said latch pulse to allow for subsequent average value calculations of said predetermined number of digital data samples;

a data selector circuit coupled to an output of said first-in, first-out memory for receiving the thirteen data bits of said digital data samples from said first-in, first-out memory;

said data selector circuit coupled to an output of said gain control circuit means for receiving said four bit logic signal from said gain control circuit means, said data circuit means, responsive to said four bit signal selecting nine data bits of the thirteen data bits of each digital data sample and providing said nine data bits of each digital data sample selected by data selector circuit to an output of said data selector circuit;

dither generating means for digitally generating a sequence of eight bit dither components; and binary adder means for combining one of said sequence of eight bit dither components, said nine data bits of each digital data sample and said sign bit for said digital data sample to produce an eight bit digital output signal.

2. The dithered analog-to-digital conversion circuit of claim 1 wherein said gating means comprises a two input AND gate.

3. The dithered analog-to-digital conversion circuit of claim 1 further comprising a binary counter connected to said dither generating means for providing addressing to said dither generating means.

4. The dithered analog-to-digital conversion circuit of claim 1 wherein said dither generating means comprises a Read Only Memory.

5. The dithered analog-to-digital conversion circuit of claim 1 wherein said serial to parallel conversion means comprises a fourteen bit serial to parallel converter.

6. The dithered analog-to-digital conversion circuit of claim 1 wherein said decoder means comprises:

a first inverter 55 having an input for receiving a first bit of said first logic signal and an output;

a second inverter 57 having an input for receiving a second bit of said first logic signal and an output;

a third inverter 59 having an input for receiving a third bit of said first logic signal and an output;

a first AND gate 61 having a first input for receiving said first bit of said first logic signal, a second input connected to the output of said second inverter 57, a third input for receiving said third bit of said first logic signal and an output connected to said down counter and said gain control circuit means;

a second AND gate 63 having a first input for receiving said first bit of said first logic signal, a second input connected to the output of said second inverter 57, a third input connected to the output of said third inverter 59 and an output connected to said down counter and said gain control circuit means;

a third AND gate 65 having a first input connected to the output of said first inverter 55, a second input for receiving the second bit of said first logic signal, a third input for receiving the third bit of said first logic signal and an output connected to said down counter and said gain control circuit means;

a fourth AND gate 67 having a first input connected to the output of said first inverter 55, a second input for receiving the second bit of said first logic signal, a third input connected to the output of said third inverter 59 and an output connected to said down counter and said gain control circuit means; and a fifth AND gate 69 having a first input connected to the output of said first inverter 55, a second input connected to the output of said second inverter 57, a third input for receiving the third bit of said first logic signal and an output connected to said down counter and said gain control circuit means;

7. The dithered analog-to-digital conversion circuit of claim 1 wherein said clock signal generating means comprises:

a first Flip-Flop 85 having a clock input for receiving said frame start signal, a data input for receiving said logic one signal, a clear input for receiving a clear signal and a Q output;

a second Flip-Flop 77 having a clock input for receiving said frame start signal, a data input connected to the Q output of said first Flip-Flop 85, a clear input and a Q output;

a first inverter 75 having an input for receiving said system clock signal and an output;

a third Flip-Flop 79 having a clock input connected to the output of said first inverter 75, a data input connected to the Q output of said second Flip-Flop 77, a clear input for receiving said clear signal and a Q output;

a first AND gate 73 having a first input for receiving said system clock signal, a second input connected to the Q output of said third Flip-Flop 79 and an output for providing said strobe data in signal;

a second inverter 81 having an input connected to the Q output of said third Flip-Flop 79 and an output;

a second AND gate 83 having a first input connected to the output of said second inverter 81, a second input for receiving said clear signal and an output connected to the clear input of said second Flip-Flop 77;

an OR gate 105 having a first input connected to the output of said second AND gate 73, a second input and an output for providing said internal clock signal;

a fourth Flip-Flop 109 having a clock input connected to the output of said OR gate 109, a data input for receiving said logic one signal, a clear input and a Q output connected to the second input of said OR gate 105;

a fifth Flip-Flop 89 having a clock input for receiving said system clock signal, a data input, a clear input connected to the Q output of said fourth Flip-Flop 109 and a Q output;

a third inverter 87 having an input connected to the Q output of said fifth Flip-Flop 89 and an output connected to the D input of said fifth Flip-Flop 89;

a sixth Flip-Flop 93 having a clock input connected to the output of said third inverter 87, a data input, a clear input connected to the Q output of said fourth Flip-Flop 109 and a Q output;

a fourth inverter 91 having an input connected to the Q output of said sixth Flip-Flop 93 and an output connected to the D input of said sixth Flip-Flop 93;

a seventh Flip-Flop 101 having a clock input connected to the output of said fourth inverter 91, a data input, a clear input connected to the Q output of said fourth Flip-Flop 109 and a Q output;

a fifth inverter 95 having an input connected to the Q output of said seventh Flip-Flop 101 and an output connected to the D input of said seventh Flip-Flop 101;

a NAND gate 103 having a first input connected to the Q output of said fifth Flip-Flop 89, a second input connected to the Q output of said sixth Flip-Flop 93, a third input connected to the Q output of said seventh Flip-Flop 101 and an output; and a third AND gate 107 having a first input connected to the output of said NAND gate 103, a second input for receiving said clear signal and an output connected to the clear input of said fourth Flip-Flop 109.

8. A dithered analog-to-digital conversion circuit with gain control, comprising:

an analog to digital converter having an input for receiving an analog video signal, said analog to digital converter converting said analog video signal to an equivalent digital signal having a plurality of digital data samples, each of said digital data samples having thirteen data bits and a sign bit;

serial to parallel conversion means for receiving said digital equivalent signal and converting said digital equivalent signal from a serial form to a parallel form;

decoder means for receiving a first logic signal and decoding said first logic signal to provide a second logic signal;

clock signal generating means for receiving a system clock signal and a frame start signal, said clock signal generating means, responsive to said system clock signal and said frame start signal, generating a strobe data in signal and an internal clock signal;

a down counter coupled to said decoder means and said clock signal generating means for receiving said internal clock signal and said second logic signal, said down counter, responsive to said internal clock signal, counting down from a first binary number set within said down counter when said down counter receives and decodes said second logic signal;

said down counter providing a latch pulse when said binary counter counts down a second binary number;

a Flip-Flop having a data input for receiving a logic one signal, a clock input connected to said down counter for receiving said logic pulse and an output, said Flip-Flop, responsive to said latch pulse, latching to the output of said Flip-Flop said logic one signal;

gating means having a first input for receiving said logic one signal, a second input for receiving said data strobe in signal, and an output, said logic one signal enabling said AND gate allowing said data strobe in signal to pass through said gating means to provide at the output of said gating means a data strobe out signal;

a first-in, first-out memory coupled to said serial to parallel conversion means, said clock signal generating means and the output of said gating means, said first-in, first-out memory, responsive to said data strobe in signal, temporarily storing the digital data samples of said digital equivalent signal, said data strobe out signal effecting a retrieval of the digital data samples of said digital equivalent signal stored in said first-in, first-out memory;

gain control circuit means for receiving a first most significant data bit, a second most significant data bit, a third most significant data bit and a fourth most significant data bit of said digital data samples;

said gain control circuit means for determining a peak magnitude value of the first, second, third and fourth most significant bits for one digital data sample of a predetermined number of digital data samples;

said gain control circuit means providing a four bit logic signal, said four bit logic signal being representative of said peak magnitude value of the first, second, third and fourth most significant bits for said one digital data sample;

said gain control circuit means receiving said latch pulse and being reset by said latch pulse to allow for subsequent determinations of said peak magnitude value;

a data selector circuit coupled to an output of said first-in, first-out memory for receiving the thirteen data bits of said digital data samples from said first-in, first-out memory;

said data selector circuit coupled to an output of said gain control circuit means for receiving said four bit logic signal from said gain control circuit means, said data circuit means, responsive to said four bit signal selecting nine data bits of the thirteen data bits of each digital data sample and providing said nine data bits of each digital data sample selected by data selector circuit to an output of said data selector circuit;

dither generating means for digitally generating a sequence of eight bit dither components;

binary adder means for combining one of said sequence of eight bit dither components, said nine data bits of each digital data sample and said sign bit for said digital data sample to produce an eight bit digital data output signal; and a gain encoder circuit coupled to said gain control circuit means for receiving said four bit logic signal;

said gain encoder circuit encoding said four bit logic signal to provide a three bit logic signal indicative of the nine data bits of each digital data sample selected by said data selector signal.

9. The gain encoder circuit of claim 8 wherein said gain encoder circuit comprises:

a first inverter 381 having an input for receiving a first bit of said four bit logic signal and an output;

a first AND gate 385 having a first input connected to the output of said first inverter 381, a second input for receiving a second bit of said four bit logic signal and an output;

a second AND gate 387 having a first input connected to the output of said first inverter 381, a second input for receiving a third bit of said four bit logic signal and an output;

a second inverter 383 having an input for receiving said third bit of said four bit logic signal and an output;

a third AND gate 389 having a first input connected to the output of said first inverter 381, a second input connected to the output of said second inverter 383, a third for receiving a fourth bit of said four bit logic signal and an output;

a first OR gate 391 having a first input connected to the output of said first AND gate 391, a second input connected to the output of said second AND gate 387 and an output;

a second OR gate 393 having a first input connected to the output of said first AND gate 391, a second input connected to the output of said third AND gate 393 and an output; and a four bit latch 395 having a first data input for receiving the first bit of said four bit signal, a second data input connected to the output of said first OR gate 391, a third data input connected to the output of said second OR gate, a clock input for receiving said internal clock signal, a clear input for receiving a clear signal, a first output for providing a first bit of said three bit logic signal, a second output for providing a second bit of said three bit logic signal and a third output for providing a third bit of said three bit logic signal.

10. The gain encoder circuit of claim 8 wherein said data selector circuit includes nine data bit selector circuits, each of said nine data bit selector circuits comprising:

a first inverter 421 having an input for receiving a first bit of said four bit logic signal and an output;

a second inverter 423 having an input for receiving a second bit of said four bit logic signal and an output;

a third inverter 425 having an input for receiving a third bit of said four bit logic signal and an output;

a fourth inverter 427 having an input for receiving a fourth bit of said four bit logic signal and an output;

a first AND gate 429 having a first input connected to the output of said first inverter 421, a second input connected to the output of said second inverter 423, a third input connected to the output of said third inverter 425 and a fourth input connected to the output of said fourth inverter 427 and an output;

a second AND gate 431 having a first input connected to the output of said second inverter 423, a second input connected to the output of said third inverter 425, a third input connected to the output of said fourth inverter 427 and a fourth input for receiving the first bit of said four bit logic signal and an output;

a third AND gate 433 having a first input connected to the output of said third inverter 425, a second input connected to the output of said fourth inverter 427 and a third input for receiving the second bit of said four bit logic signal and an output;

a fourth AND gate 435 having a first input connected to the output of said fourth inverter 427, a second input the third bit of said four bit logic signal and an output;

a fifth AND gate 437 having a first input connected to the output of said first AND gate 429, a second input for receiving a first data bit of the thirteen data bits of each digital data sample and an output;

a sixth AND gate 439 having a first input connected to the output of said second AND gate 431, a second input for receiving a second data bit of the thirteen data bits of each digital data sample and an output;

a seventh AND gate 441 having a first input connected to the output of said third AND gate 433, a second input for receiving a third data bit of the thirteen data bits of each digital data sample and an output;

an eighth AND gate 443 having a first input connected to the output of said fourth AND gate 435, a second input for receiving a fourth data bit of the thirteen data bits of each digital data sample and an output;

a ninth AND gate having a first input for receiving the fourth bit of said four bit logic signal, a second input for receiving a fifth data bit of the thirteen data bits of each digital data sample and an output; and an OR gate 447 having a first input connected to the output of said fifth AND gate 437, a second input connected to the output of said sixth AND gate 439, a third input connected to the output of said seventh AND gate 441, a fourth input connected to the output of said eighth AND gate 443 and a fifth input connected to the output of said ninth AND gate 445 and an output connected to said binary adder means.

* * * * *